(12) United States Patent
Shigetoshi

(10) Patent No.: US 11,335,720 B2
(45) Date of Patent: May 17, 2022

(54) VERTICAL ELECTRODE STRUCTURE COMPRISING LOW-RESISTANCE FILM FOR PREVENTING DAMAGE DURING ETCHING

(71) Applicant: SONY SEMICONDUCTOR SOLUTIONS CORPORATION, Kanagawa (JP)

(72) Inventor: Takushi Shigetoshi, Nagasaki (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 35 days.

(21) Appl. No.: 16/349,886

(22) PCT Filed: Nov. 13, 2017

(86) PCT No.: PCT/JP2017/040764
§ 371 (c)(1),
(2) Date: May 14, 2019

(87) PCT Pub. No.: WO2018/123299
PCT Pub. Date: Jul. 5, 2018

(65) Prior Publication Data
US 2020/0083273 A1    Mar. 12, 2020

(30) Foreign Application Priority Data
Dec. 26, 2016   (JP) .............................. JP2016-250522

(51) Int. Cl.
*H01L 27/146* (2006.01)
*H01L 21/3065* (2006.01)
(52) U.S. Cl.
CPC .... *H01L 27/14636* (2013.01); *H01L 21/3065* (2013.01); *H01L 27/1469* (2013.01); *H01L 27/14634* (2013.01)

(58) Field of Classification Search
CPC ......... H01L 27/14636; H01L 27/14634; H01L 27/1469; H01L 27/088; H01L 21/8234
(Continued)

(56) References Cited

U.S. PATENT DOCUMENTS

| 5,911,857 A * | 6/1999 | Kim ..................... C23C 14/0036 |
| | | 204/192.15 |
| 6,140,223 A * | 10/2000 | Kim .................. H01L 21/76846 |
| | | 438/629 |

(Continued)

FOREIGN PATENT DOCUMENTS

| CN | 105409002 A | 3/2016 |
| JP | 2004-152967 A | 5/2004 |

(Continued)

OTHER PUBLICATIONS

International Search Report and Written Opinion of PCT Application No. PCT/JP2017/040764, dated Jan. 23, 2018, 09 pages of ISRWO.

*Primary Examiner* — Thao X Le
*Assistant Examiner* — Gardner W. S. Swan
(74) *Attorney, Agent, or Firm* — Chip Law Group

(57) ABSTRACT

To suppress variation in transistor characteristics due to charging damage to relieve restrictions on design necessary for avoiding the charging damage and improve the degree of freedom in design for increasing semiconductor integration. A semiconductor device includes a vertical electrode formed in a vertical hole extending from an opening portion toward a portion to be connected in a thickness direction of a base, and having a structure in which a barrier metal film and a conductive material are stacked sequentially from a side close to an insulating film exposed to the vertical hole, and a low-resistance film provided to lie between the barrier metal film and the insulating film except a vicinity of the (Continued)

portion to be connected, and having a lower resistance value than a resistance value of the insulating film.

11 Claims, 23 Drawing Sheets

(58) Field of Classification Search
USPC .......................................................... 257/431
See application file for complete search history.

(56) References Cited

U.S. PATENT DOCUMENTS

| | | | | |
|---|---|---|---|---|
| 2003/0143839 A1* | 7/2003 | Raaijmakers | ..... | H01L 21/76864 438/633 |
| 2008/0242078 A1* | 10/2008 | Sprey | ................ | H01L 21/76873 438/643 |
| 2009/0001584 A1* | 1/2009 | Kim | .................. | H01L 23/532 257/751 |
| 2009/0206485 A1* | 8/2009 | Yang | .................... | H01L 23/5226 257/751 |
| 2009/0218699 A1* | 9/2009 | Torres | ............... | H01L 21/76807 257/774 |
| 2010/0327446 A1* | 12/2010 | Yang | .................. | H01L 21/76846 257/751 |
| 2011/0175236 A1* | 7/2011 | Lou | ........................ | H01L 23/481 257/774 |
| 2013/0273701 A1 | 10/2013 | Ochimizu et al. | | |
| 2013/0307155 A1 | 11/2013 | Mitsuhashi | | |
| 2016/0204156 A1 | 7/2016 | Togashi | | |
| 2017/0117218 A1* | 4/2017 | Liu | ................... | H01L 21/76883 |

FOREIGN PATENT DOCUMENTS

| | | |
|---|---|---|
| JP | 2008-210952 A | 9/2008 |
| JP | 2010-135348 A | 6/2010 |
| JP | 2013-239589 A | 11/2013 |
| KR | 10-2016-0045054 A | 4/2016 |
| WO | 2012/090292 A1 | 7/2012 |
| WO | 2015/025723 A1 | 2/2015 |

* cited by examiner

VERTICAL ELECTRODE STRUCTURE COMPRISING LOW-RESISTANCE FILM FOR PREVENTING DAMAGE DURING ETCHING

CROSS REFERENCE TO RELATED APPLICATIONS

This application is a U.S. National Phase of International Patent Application No. PCT/JP2017/040764 filed on Nov. 13, 2017, which claims priority benefit of Japanese Patent Application No. JP 2016-250522 filed in the Japan Patent Office on Dec. 26, 2016. Each of the above-referenced applications is hereby incorporated herein by reference in its entirety.

TECHNICAL FIELD

The present technology relates to a semiconductor device, a method of manufacturing a semiconductor device, and a solid-state image sensor.

BACKGROUND ART

In recent years, improvements in semiconductor integration density have begun to deteriorate due to various factors such as limitations of microfabrication and increase in manufacturing cost. Three-dimensional mounting technologies have drawn attention as technologies that overcome this situation. The three-dimensional mounting technology is a technology of stacking and integrating a plurality of individually manufactured chips in a thickness direction of a substrate and is expected as a technology for improving the integration of semiconductor devices to realize high functions.

A through electrode (a silicon through electrode or a chip through electrode) as a vertical electrode is used as electrical connection between the stacked chips in a three-dimensionally mounted semiconductor device. The through electrode is generally formed by a manufacturing method including a step of excavating the chips in the thickness direction of the chips by a plasma etching method to form a through hole leading to a wiring part to be connected. At that time, there is a possibility that an electric charge of plasma colliding with a hole bottom during the excavation is charged inside the through hole and damage other parts via the wiring part to be connected. Specifically, for example, there is a possibility that a thin insulating film (a gate insulating film or the like) in contact with any part electrically connected to the wiring part to be connected is destroyed or deteriorated.

Patent Documents 1 and 2 are disclosed as technologies for preventing such destruction or deterioration due to charging damage to an inside of a through hole.

Patent Document 1 discloses a technology of preventing charging inside a through hole in a step of cleaning a bottom surface of a via hole performed before filling an electrode material in the via hole after forming the through hole. Specifically, after a conductive film covering an inner surface of the via hole is formed by sputtering of TiN, the conductive film deposited on the bottom surface of the via hole is removed by anisotropic ion etching, and a surface of lower layer wiring exposed to the bottom surface of the via hole is cleaned at the final stage of the anisotropic ion etching. Since the anisotropic ion etching is performed in the state of covering the inner surface of the via hole with the conductive film in this way, the surface of the lower layer wiring exposed to the bottom surface of the via hole can be cleaned without charging the lower layer wiring by the anisotropic ion etching.

Patent Document 2 discloses etching processing of alternately performing a plasma etching step using $C_4F_6$, $O_2$, and Ar and a charge-up reduction step using only Ar at the time of processing a fine contact hole of submicron or less. In the plasma etching step, etching of a wafer is performed, and negative charges are accumulated around a resist mask and positive charges are accumulated in a bottom of the contact hole, and a fluorocarbon film is formed on an inner wall of the contact hole. In the charge-up reduction step, ions generated in the Ar only state sputter the fluorocarbon film to improve film quality of the fluorocarbon film, thereby improving conductivity, and the negative charges around the resist mask are led to the bottom of the contact hole and neutralized. The step can reduce distortion of the contact hole caused by the charge-up.

CITATION LIST

Patent Document

Patent Document 1: Japanese Patent Application Laid-Open No. 9-246380
Patent Document 2: Japanese Patent Application Laid-Open No. 2007-134530

SUMMARY OF THE INVENTION

Problems to be Solved by the Invention

The technology described in Patent Document 1 is effective for reducing the charge to the inside of the through hole in the step of cleaning the bottom of the via hole. However, Patent Document 1 does not mention charging at the time of plasma etching for forming the via hole. In a structure such as a through electrode, which is severe against charging, the thin insulating film in contact with any part electrically connected to the wiring part to be connected is destroyed or deteriorated at the time of opening to the wiring part by etching, and measures only at the time of cleaning before sputtering are insufficient as measures against the charging damage.

Although the technology disclosed in Patent Document 2 can be presumed to have a certain effect in reducing the charging damage at the time of forming the through electrode. However, the conductivity of carbon polymer as the fluorocarbon film is not so high and thus there is a limit to reduction of the charging damage. Furthermore, in the case of using the technology in Patent Document 2 for actual production, a large amount of reaction products containing a mixture of the carbon polymer and wiring metal (mainly Cu wiring is expected), which is difficult to remove, is generated and adversely affects the yield and reliability. In addition, since the etching and deposition of the fluorocarbon film are repeated, there is a disadvantage that processing time becomes long.

The present technology has been made in view of the above-described problems, and an object of the present technology is to suppress destruction and deterioration of a thin insulating film in contact with any of parts electrically connected to a wiring part to be connected of a vertical electrode due to charging damage, thereby reducing limitations on design necessary for avoiding the charging damage and improving the degree of freedom in design for increasing semiconductor integration.

Solutions to Problems

One aspect of the present technology is a semiconductor device including a vertical electrode formed in a vertical hole extending from an opening portion toward a portion to be connected along a thickness direction of a base, and having a structure in which a barrier metal film and a conductive material are stacked sequentially from a side close to an insulating film exposed to the vertical hole, and a low-resistance film provided to lie between the barrier metal film and the insulating film except a vicinity of the portion to be connected, and having a lower resistance value than a resistance value of the insulating film.

One aspect of the present technology is a method of manufacturing a semiconductor device, the method including: a first step of forming a preliminary vertical hole in a base, the preliminary vertical hole having an insulating film exposed to a hole wall and having a hole bottom having a depth not reaching a portion to be connected, a second step of forming a low-resistance film having a lower resistance value than a resistance value of the insulating film inside the preliminary vertical hole from above the insulating film, a third step of opening the hole bottom of the preliminary vertical hole with the low-resistance film and the insulating film up to the portion to be connected by etching to form a vertical hole, and a fourth step of forming a barrier metal film in the vertical hole communicating with the portion to be connected, and forming or filling a conductive material from above the barrier metal film to form a vertical electrode.

Furthermore, one of selective aspects of the present technology is a solid-state image sensor including a vertical electrode formed in a vertical hole extending from an opening portion in a back surface of a semiconductor substrate toward a portion to be connected in a wiring layer stacked on a surface of the semiconductor substrate along a thickness direction of the semiconductor substrate, in which the vertical electrode has a structure in which a barrier metal film and a conductive material are stacked sequentially from a side close to an insulating film exposed to the vertical hole, and a low-resistance film having a lower resistance value than a resistance value of the insulating film is provided to lie between the barrier metal film and the insulating film except a vicinity of the portion to be connected.

Note that the semiconductor device and the solid-state image sensor described above include various aspects such as being implemented in a state of being incorporated in another device or being implemented together with other methods.

Effects of the Invention

According to the present technology, variation in transistor characteristics due to charging damage is suppressed, whereby restrictions on design necessary for avoiding the charging damage can be reduced, and the degree of freedom in design for increasing semiconductor integration can be improved. Note that the effects described in the present specification are merely examples and are not limited, and additional effects may be exhibited.

MODE FOR CARRYING OUT THE INVENTION

Hereinafter, the present technology will be described according to the following order.

(A) First Embodiment:
(B) Second Embodiment:
(C) Third embodiment:
(D) Fourth Embodiment:
(E) Fifth Embodiment:

(A) First Embodiment

Figure 1:
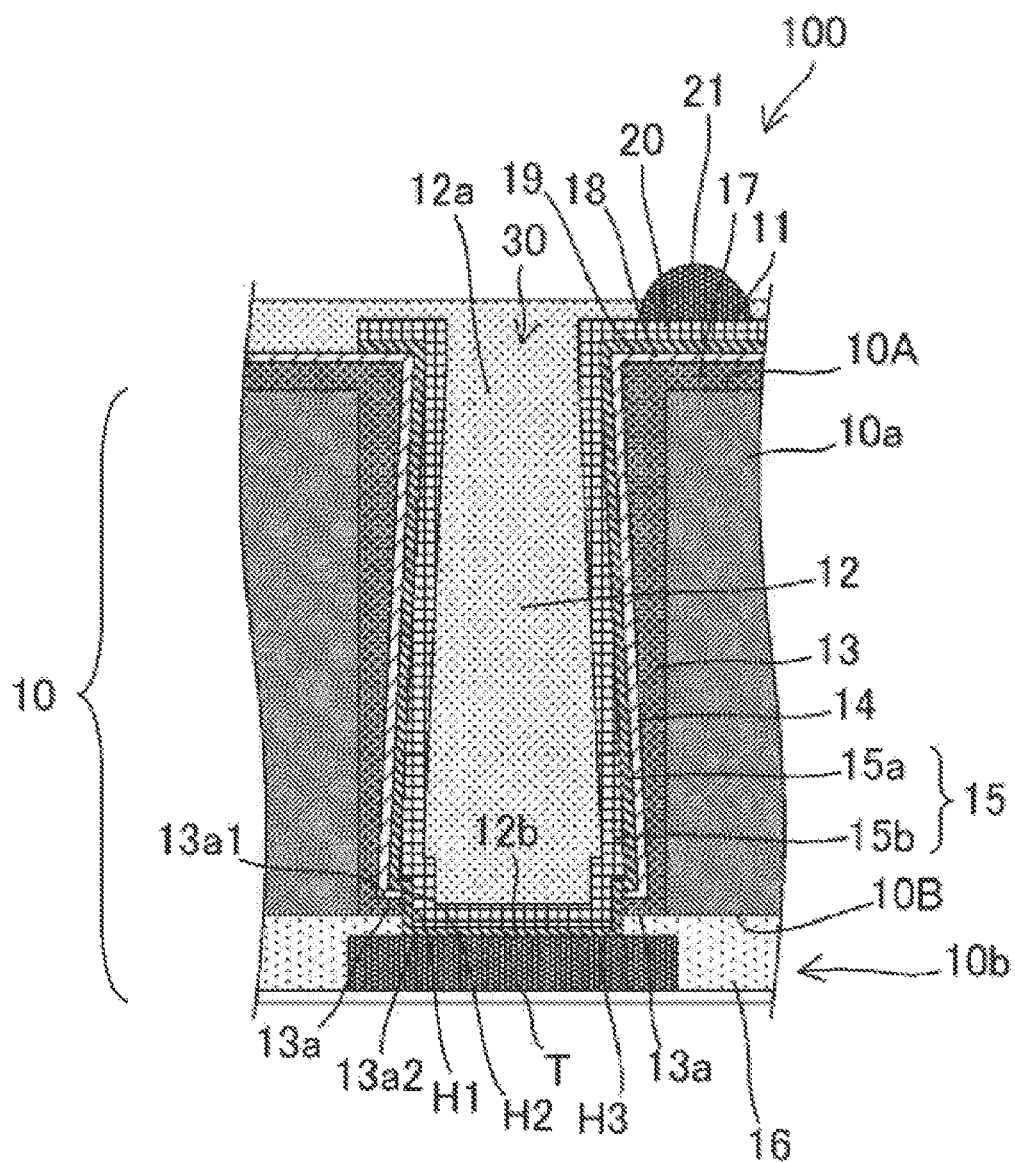
FIG. 1 is a view illustrating a cross section of a main part of a semiconductor device according to a first embodiment.
Figure 2:
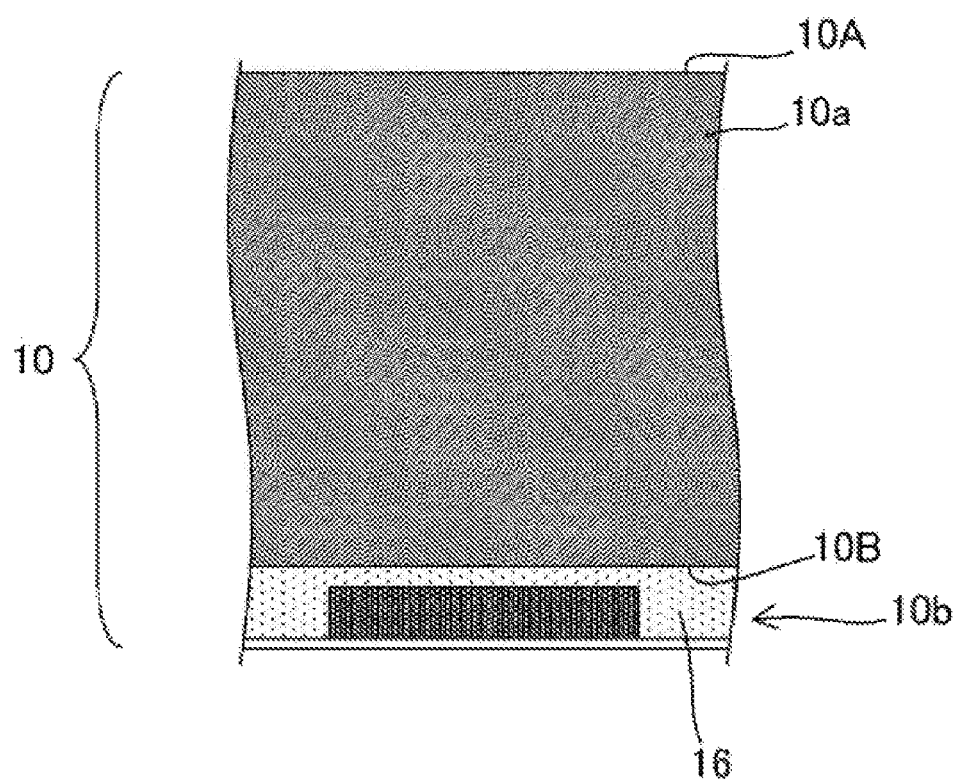
FIG. 2 is a view for describing an example of a method of manufacturing a semiconductor device according to the first embodiment.

FIG. 1 is a view illustrating a cross section of a main part of a semiconductor device 100 according to the present embodiment.

The semiconductor device 100 is a semiconductor chip formed using silicon or the like and includes a vertical electrode 30 extending along a thickness direction of the semiconductor device 100. Hereinafter, a portion in the semiconductor chip, the portion serving as a base before the vertical electrode 30 is formed, is called base 10.

The vertical electrode 30 electrically connects wiring 11 extending along one surface 10A of the base 10 and a portion to be connected T such as an electrode pad inside the base 10. The vertical electrode 30 is a concept including various aspects and includes a bottomed via and a contact formed in a bottomed hole extending along a thickness direction of the base 10.

Note that, hereinafter, a case in which specific wiring in a wiring layer 10b stacked and formed on a surface of a semiconductor substrate 10a such as a silicon substrate is the portion to be connected T will be described as an example, and a case in which the vertical electrode 30 is a through electrode penetrating from a back surface of the semiconductor substrate 10a (the back surface corresponds to the one surface 10A of the base 10) to the specific wiring in the wiring layer 10b will be described as an example.

The vertical electrode 30 is provided with an insulating film 13 as a first insulating film covering an inner surface of a vertical hole 12 communicating with the portion to be connected T of the base 10, a low-resistance film 14 as a substantially tubular film covering a most part of the insulating film 13 inside the insulating film 13, and a tubular or columnar electrode portion 15 further nested in the tube of the low-resistance film 14.

Note that the insulating film 13 may be stacked and formed in the vertical hole 12 or may be an exposed insulating film of the base 10 itself by forming the vertical hole 12. Hereinafter, the case of stacking and forming the insulating film 13 in the vertical hole 12 will be described as an example.

An electrode portion 15 has a barrier metal film 15a and a conductive portion 15b. The barrier metal film 15a is a member that isolates a metal material of the conductive portion 15b not to diffuse into a base-side member and is provided between the conductive portion 15b and the other members (the low-resistance film 14, the insulating film 13, and the portion to be connected T). The barrier metal film 15a is formed using at least one of Ti, TiN, Ta, or TaN, for example. The conductive portion 15b is formed using at least one of Cu or W, for example.

Note that the conductive portion 15b in the vertical hole 12 may have a film shape or may have a columnar shape filled in a tubular space surrounded by the barrier metal film 15a. In the case of forming the conductive portion 15b in the film shape, a resin covering the wiring 11 is integrally continuously filled in a cavity inside the conductive portion 15b. Another film may lie between the insulating film 13, and the barrier metal film 15a and the conductive portion 15b.

The vertical electrode 30 has a diameter of 10 μm or more and an aspect ratio of 1 or more, and more favorably the aspect ratio of 3 or more.

The insulating film 13 formed on an inner wall of the vertical hole 12 has a tapered shape with the thickness gradually decreasing from an opening portion 12a toward a hole bottom 12b of the vertical hole 12. In other words, the vertical hole 12 has an overhang shape in which the inner wall gradually overhangs from the hole bottom 12b toward the opening portion 12a.

The insulating film 13 has an extending portion 13a that bents and extends from the insulating film 13 covering the inner wall of the vertical hole 12 toward a substantial center in a radial direction of the vertical hole 12 in a vicinity of the hole bottom 12b. The extending portion 13a has a length not reaching the substantial center in the radial direction of the vertical hole 12 and has a ring-like flange shape projecting inward from the inner wall of the vertical hole 12 in the vicinity of the hole bottom 12b of the vertical hole 12. Conversely, the vicinity of the hole bottom 12b of the vertical hole 12 has an opening H1 not covered with the insulating film.

The low-resistance film 14 is continuously provided from the vicinity of the opening portion 12a to the vicinity of the hole bottom 12b of the vertical hole 12 inside the insulating film 13.

Specifically, the low-resistance film 14 is provided along an inner side of the insulating film 13 extending along the inner wall of the vertical hole 12 and is provided along a side surface 13a1 on the opening portion 12a side, of the extending portion 13a extending along the hole bottom 12b of the vertical hole 12. The low-resistance film 14 is not provided on an end surface 13a2 of the extending portion 13a on the opening H1 side, and the low-resistance film 14 provided on the side surface 13a1 has an opening H2 having a shape substantially equal to the opening H1 of the extending portion 13a.

As described above, although the low-resistance film 14 extends from the vicinity of the opening to the vicinity of the hole bottom 12b of the vertical hole 12, the low-resistance film 14 is not in contact with the hole bottom 12b, and the hole bottom 12b of the vertical hole 12 has a portion having a side wall not provided with the low-resistance film 14. The portion having a side wall not provided with the low-resistance film 14, of the vertical hole 12 (a portion closer to a portion to be connected T than an end portion of the low-resistance film 14) has an aspect ratio of less than 1 (excluding 0) and more favorably the aspect ratio of 0.1 to 0.2 or less (excluding 0). As described above, since the portion having the side wall not provided with the low-resistance film 14, of the vertical hole 12, is low in the aspect ratio, after the low-resistance film 14 is formed, a charge charged in the vicinity of the hole bottom 12b of the vertical hole 12 is neutralized by charge transfer via the low-resistance film 14.

The low-resistance film 14 formed on the inner wall of the insulating film 13 has a tapered shape with the thickness increasing toward the opening portion 12a of the vertical hole 12 and gradually decreasing toward the hole bottom 12b in the depth direction of the vertical hole 12.

As the low-resistance film 14, various materials can be used as long as the materials have lower resistance than the insulating film 13 and the extending portion 13a, are less likely to have (metal) diffusion and interaction with the insulating film 13, the extending portion 13a, the semiconductor substrate 10a, and the like, and have favorable adhesion to the stacked films on both sides (the insulating film 13, the extending portion 13a, and the barrier metal film 15a in the example illustrated in FIG. 1). A resistance value of the low-resistance film 14 is, for example, less than $10^6$ Ωcm as a criterion.

Specific examples of the material of the low-resistance film 14 include Ti, TiN, Ta, TaN, Zr, ZrN, Hf, HfN, Ru, Co, W, WN, Mn, MnN, Al, Sn, Zn, Si, Ge, Ga, SiN, and the like. Note that, as SiN, SiN having an atomic ratio of N of 50% or less is favorably used, for example, rather than stoichiometric SiN.

The low-resistance film 14 itself may have a similar barrier property to the barrier metal film 15a that prevents metal diffusion of the conductive portion 15b. Specific examples of the material of the low-resistance film 14 having a barrier metal property include Ti, TiN, Ta, TaN, Zr, ZrN, Hf, HfN, Ru, Co, W, WN, Mn, and MnN.

An insulating film 16 (premetal interlayer insulating film or the like) as a second insulating film lies between the portion to be connected T and the extending portion 13a on the hole bottom 12b of the vertical hole 12. The insulating film 16 has an opening H3 formed in a substantially same shape at a substantially same position as the opening H1 of the extending portion 13a and the opening H2 of the low-resistance film 14 in plan view. In other words, the hole bottom 12b is provided with an opening penetrating the stacked portion of the extending portion 13a, the low-resistance film 14, and the insulating film 16 in an up-down direction (the depth direction of the vertical hole 12) as a whole.

An insulating film 17, a low-resistance film 18, a barrier metal film 19, and a conductive portion 20 are sequentially stacked on the one surface 10A of the base 10. Other films may lie between these films. These films are integrally and continuously formed with the corresponding films in the vertical hole 12. In other words, the insulating film 17 is integrally and continuously formed with the insulating film 13, the low-resistance film 18 is integrally and continuously formed with the low-resistance film 14, the barrier metal film 19 is integrally and continuously formed with the barrier metal film 15a, and the conductive portion 20 is integrally and continuously formed with the conductive portion 15b, respectively. The wiring 11 formed with the conductive portion 20 on the surface 10A is provided with a bump 21.

FIGS. 2 to 7 are views for describing an example of a method of manufacturing the semiconductor device 100 according to the present embodiment.

First, the insulating film 16 (premetal interlayer insulating film) including a silicon oxide film is formed on the semiconductor substrate 10a on which elements such as MOS transistors are formed, and the wiring layer 10b is sequentially stacked and formed on the insulating film 16. Specific wiring of a lower device to be the portion to be connected T is formed in the vicinity of a boundary in the insulating film 16 with the wiring layer 10b. The base 10 thus fabricated is turned upside down to have the state illustrated in FIG. 2.

Figure 3:
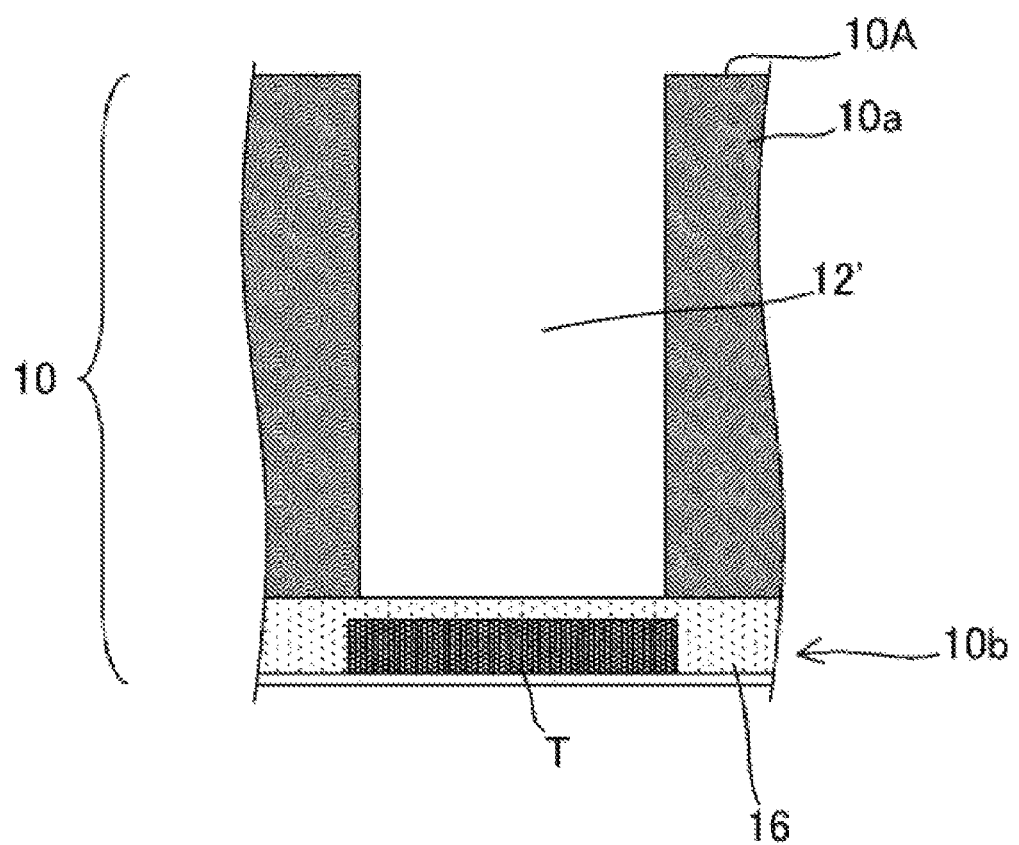
FIG. 3 is a view for describing the example of a method of manufacturing a semiconductor device according to the first embodiment.

Next, as illustrated in FIG. 3, a through hole 12' as a preliminary vertical hole penetrating the semiconductor substrate 10a is formed by lithography and plasma etching. The through hole 12' penetrates the semiconductor substrate 10a and is formed to a depth not reaching the portion to be connected T.

Figure 4:
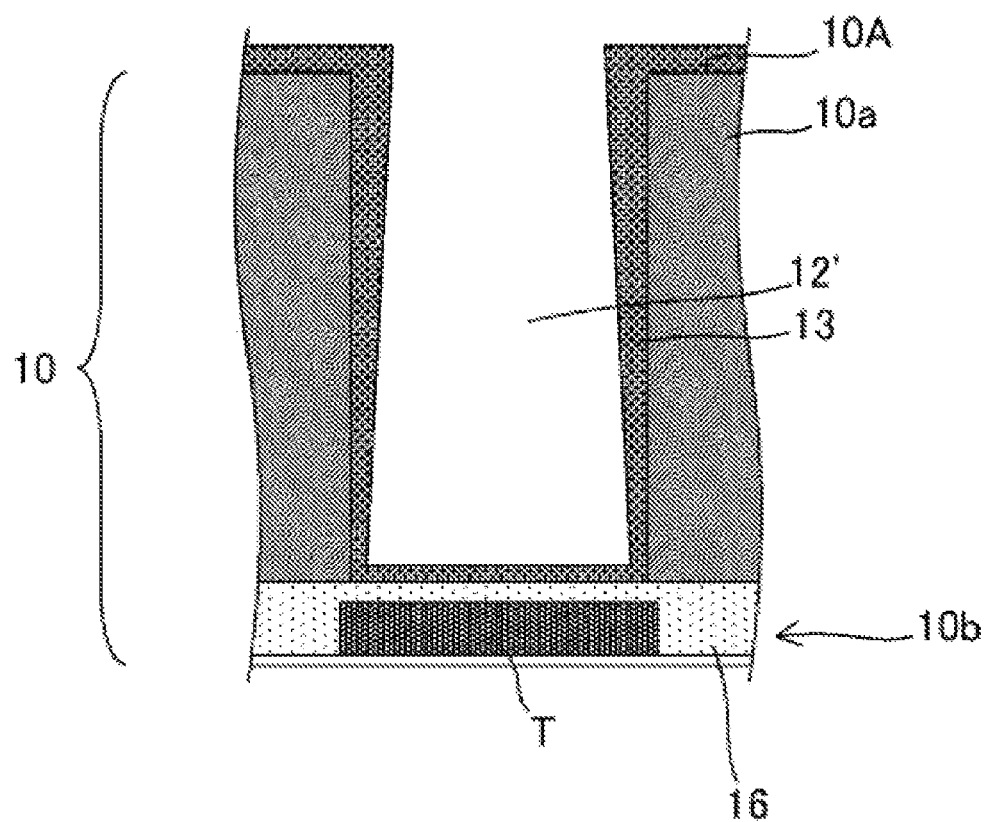
FIG. 4 is a view for describing the example of a method of manufacturing a semiconductor device according to the first embodiment.

Next, as illustrated in FIG. 4, the insulating film 13 for insulating the semiconductor substrate 10a and the vertical electrode 30 is formed. The insulating film 13 is, for example, a silicon oxide film and is formed by a plasma-enhanced chemical vapor deposition (PE-CVD) method. The insulating film 13 formed by the PE-CVD method has an overhang shape gradually overhanging from a bottom toward an opening of the through hole 12'. Furthermore, the insulating film 17 is stacked and formed on the one surface 10A of the semiconductor substrate 10a, and an insulating film, which will be removed while being partly left as the extending portion 13a in a later step, is stacked and formed on the entire bottom of the through hole 12', at the same time with the formation of the insulating film 13.

Figure 5:
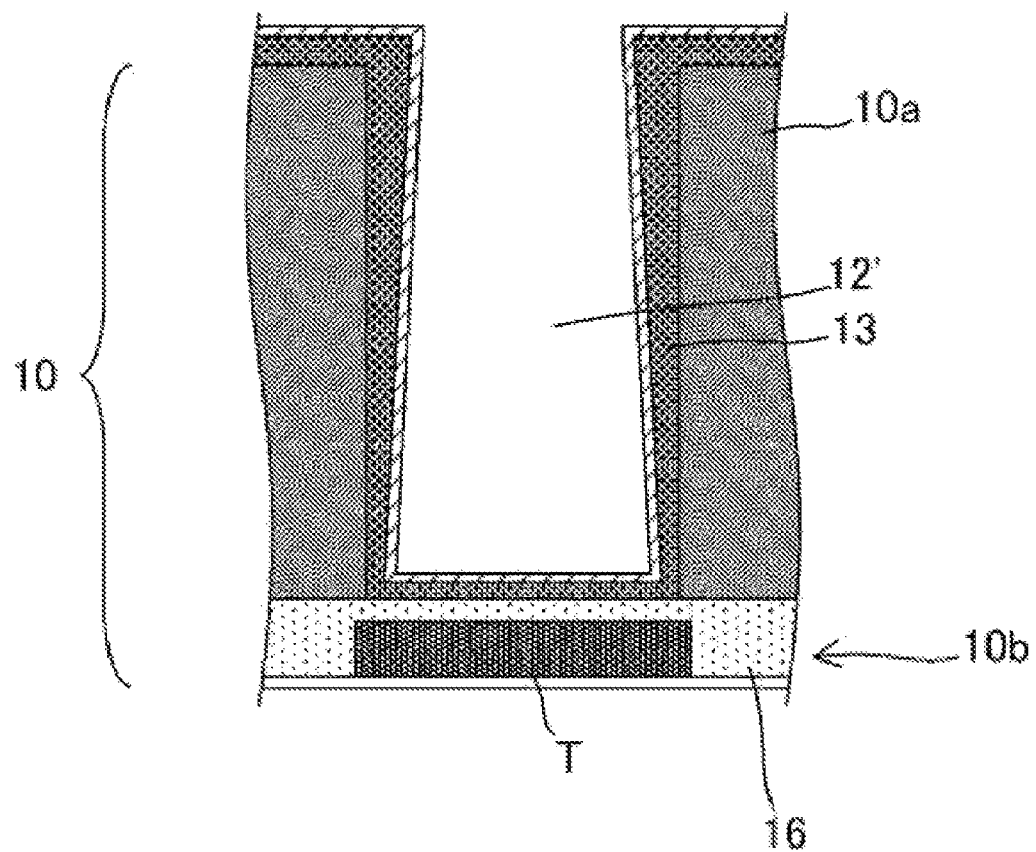
FIG. 5 is a view for describing the example of a method of manufacturing a semiconductor device according to the first embodiment.

Next, as illustrated in FIG. 5, the low-resistance film 14 is stacked and formed on the insulating film 13. The low-resistance film 14 is formed by a low coverage film forming method such as PE-CVD or the like. The low-resistance film 14 is highly compatible with a semiconductor process, and various materials having a resistance value of less than $10^6$ Ωcm can be used. Specifically, for example, Ti, TiN, Ta, TaN, Zr, ZrN, Hf, HfN, Ru, Co, W, WN, Mn, MnN, Al, Sn, Zn, Si, Ge, Ga, or SiN can be used. Note that, as SiN, SiN having an atomic ratio of N of 50% or less is favorably used, for example, rather than stoichiometric SiN. Hereinafter, a case of forming the low-resistance film 14 with TiN will be described as an example.

Figure 6:
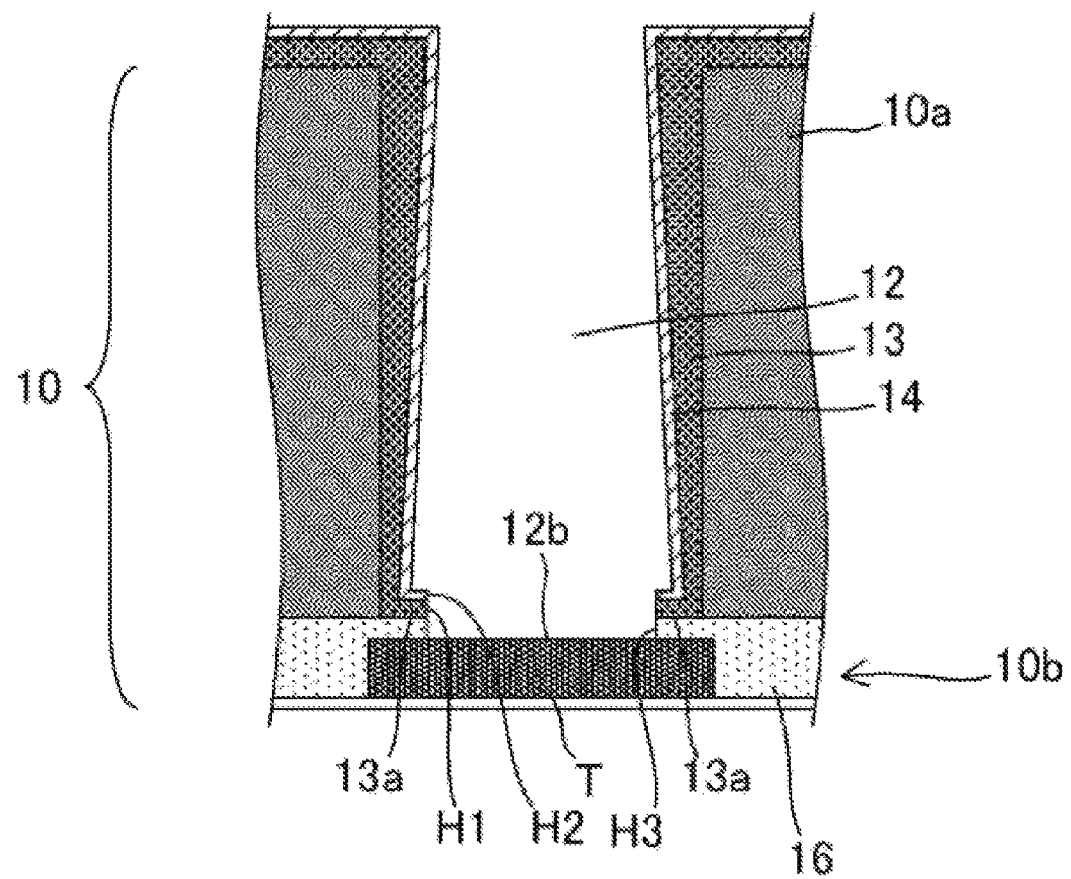
FIG. 6 is a view for describing the example of a method of manufacturing a semiconductor device according to the first embodiment.

Next, as illustrated in FIG. 6, an opening is formed in the bottom of the through hole 12' to expose the portion to be connected T to form the vertical hole 12. The low-resistance film 14 and the insulating film 13 on the bottom of the through hole 12' and the insulating film 16 as the premetal interlayer insulating film on the portion to be connected T are removed by plasma etching, for example.

In a case of processing the low-resistance film 14 and the insulating films 13 and 16 at once, etching is performed using at least one or more kinds of a fluorocarbon gas, a hydrofluorocarbon gas, or a rare gas such as Ar, as an etching gas.

In a case of processing the low-resistance film 14 and the insulating films 13 and 16 separately, etching of the low-resistance film 14 is performed using at least one or more kinds of rare gas such as $Cl_2$, $BCl_3$, HBr, or Ar as an etching gas, and then etching of the insulating films 13 and 16 is performed using at least one or more kinds of a fluorocarbon gas, a hydrofluorocarbon gas, or a rare gas such as Ar, as an etching gas.

Since the low-resistance film 14 formed by the PE-CVD method is thickly formed in a field portion of the semiconductor substrate 10a as compared with the bottom of the through hole 12', the low-resistance film 14 remains in the field portion even after etching, and so-called hard mask effect of suppressing scraping of the insulating film 17 in the field portion can be expected.

Next, a cleaning step of removing polymer adhering to the side surface of the vertical hole 12 and the like and a residue of the portion to be connected T is performed by etching. The cleaning step is performed with an organic chemical solution or diluted hydrofluoric acid. Note that, in a case of using a metal material having diffusibility such as Cu for the portion to be connected T and using Ti, TiN, Ta, TaN, Zr, ZrN, Hf, HfN, Ru, Co, W, WN, Mn, MnN, or the like, having a barrier metal property as the low-resistance film 14, there is also an effect of preventing diffusion of the metal material adhering to the side surface to the base 10 during etching.

Figure 7:
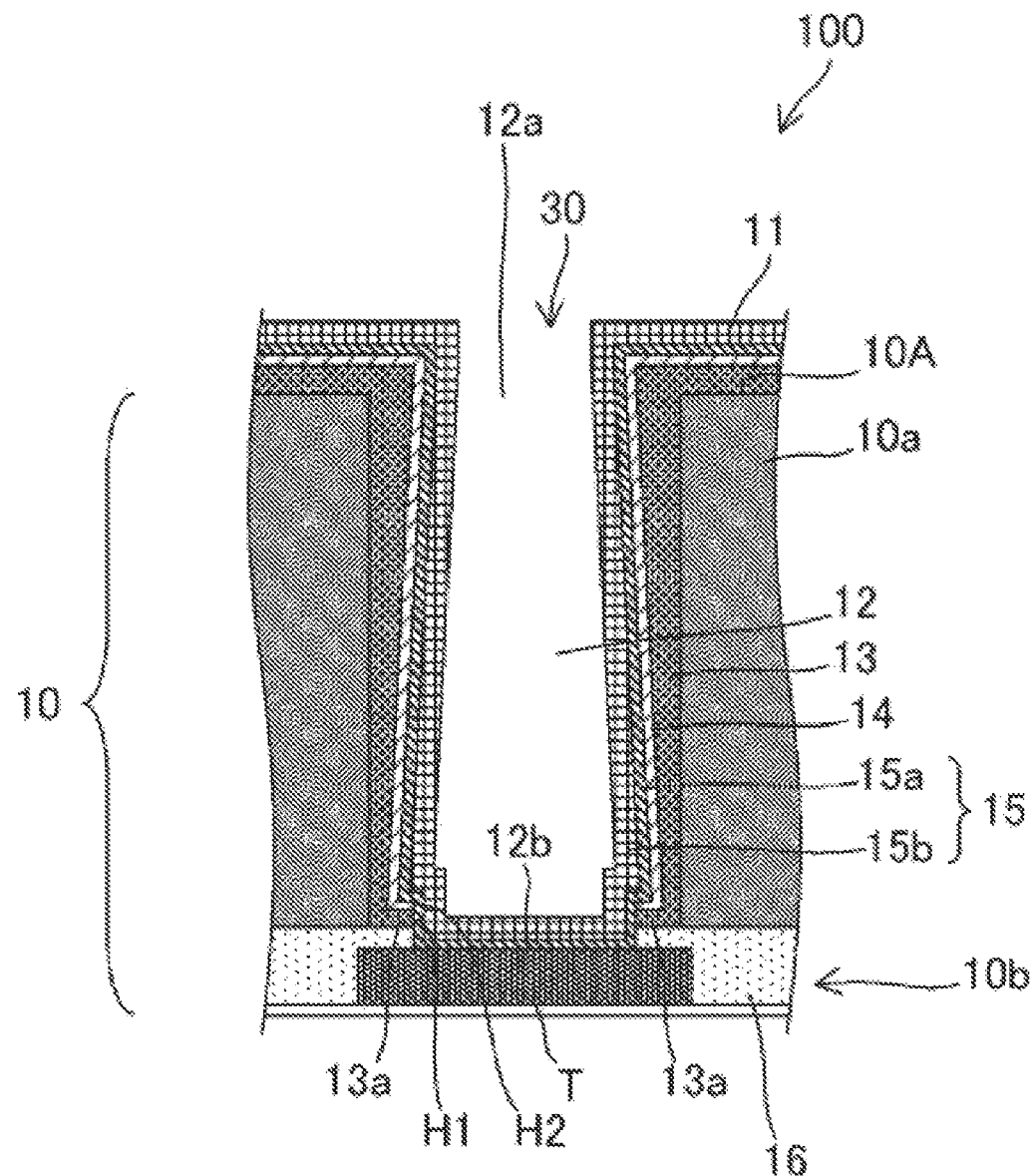
FIG. 7 is a view for describing the example of a method of manufacturing a semiconductor device according to the first embodiment.

Next, the barrier metal film 15a is formed in the vertical hole 12 and in the field portion of the base 10. The barrier metal film 15a is fabricated by, for example, PE-CVD by depositing at least one kind of Ti, TiN, Ta, or TaN. Next, the conductive portion 15b is formed. The conductive portion 15b is fabricated by, for example, a plating method, by forming a conductive material containing at least one of Cu or W. As a result, as illustrated in FIG. 7, the conductive material is formed or filled in the vertical hole 12 to form the conductive portion 15b. Thereafter, unnecessary portions of the conductive portion 15b, the barrier metal film 15a, and the low-resistance film 14 formed in the field portion are removed by wet etching, and the wiring 11 is formed in the field portion.

The above-described semiconductor device 100 is fabricated by the above-described manufacturing method.

(B) Second Embodiment

Figure 8:
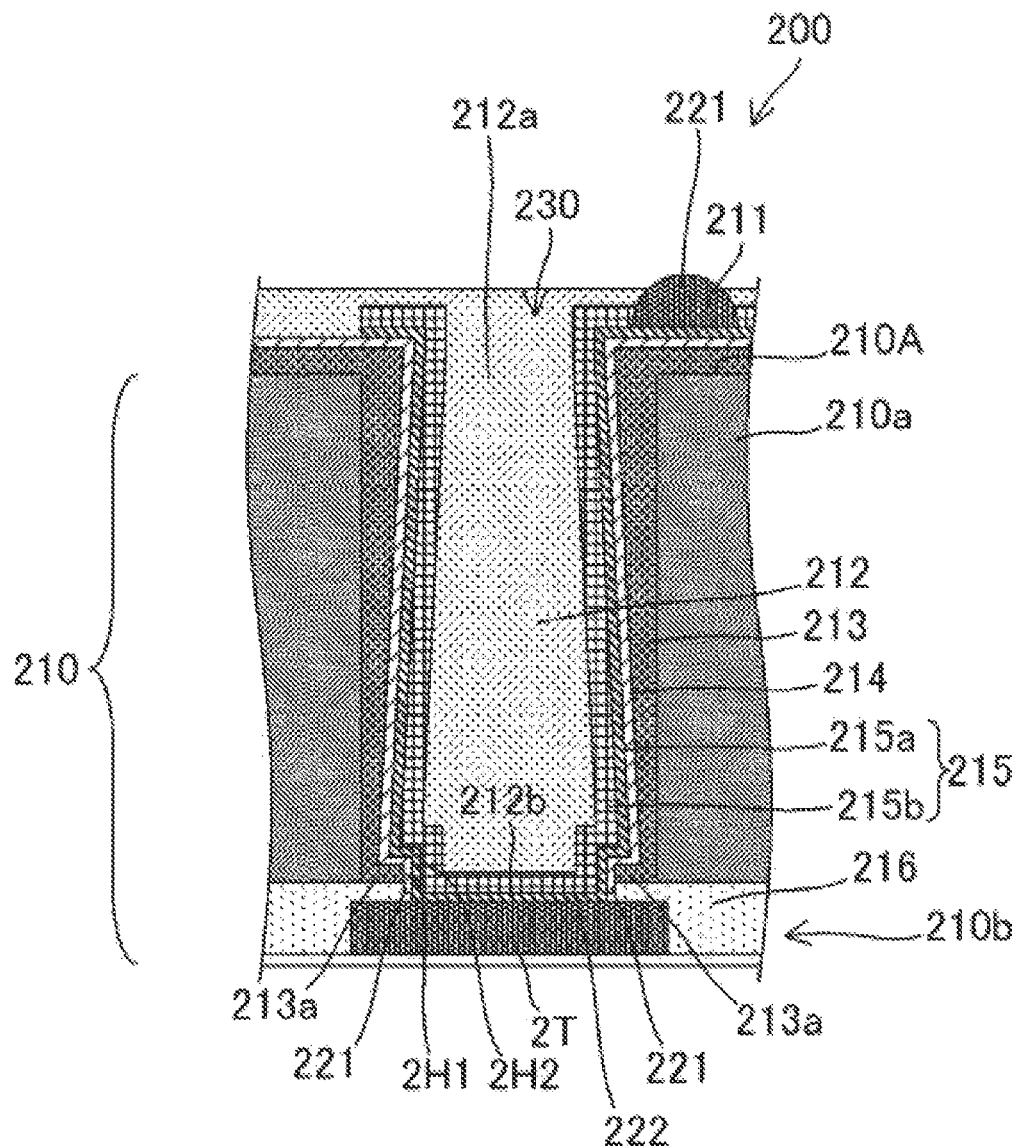
FIG. 8 is a view illustrating a cross section of a main part of a semiconductor device according to a second embodiment.

FIG. 8 is a view illustrating a cross section of a main part of a semiconductor device 200 according to the present embodiment. The semiconductor device 200 has a similar configuration to the above-described semiconductor device 100 except shapes of a low-resistance film and an insulating film in a vicinity of a hole bottom and a barrier metal film and a conductive portion formed on the low-resistance film and the insulating film.

Therefore, hereinafter, shapes and a method of manufacturing the low-resistance film and the insulating film in the vicinity of the hole bottom and the barrier metal film and the conductive portion formed on the low-resistance film and the insulating film of the semiconductor device 200 will be mainly described and detailed description of other configurations is omitted, and signs are given by adding 2 to the beginning of the signs of the configuration of the semiconductor device 100 as necessary.

A low-resistance film 214 of the semiconductor device 200 is similar to the low-resistance film 14 according to the first embodiment in being continuously provided from a vicinity of an opening portion 212a to a vicinity of a hole bottom 212b of a vertical hole 212 inside an insulating film 213.

The low-resistance film 214 is provided with an opening end surface cover portion 221 provided along an inner side of the insulating film 213 extending along an inner wall of the vertical hole 212, provided along a side surface close to the opening portion 212a of the extending portion 213a extending along the hole bottom 212b of the vertical hole 212, and further extending toward a portion to be connected 2T along an end surface of the extending portion 213a on an opening 2H1 side.

The semiconductor device 200 illustrated in FIG. 8 is provided with a recess 222 continuously formed with a substantially same width as the opening 2H1 of the extending portion 213a in an insulating film 216, and the opening end surface cover portion 221 extends to cover both the opening 2H1 of the extending portion 213a and an inner surface of the recess 222. The recess 222 does not reach the portion to be connected 2T and thus the opening end surface cover portion 221 has a length not reaching the portion to be connected 2T. Even in this case, a portion closer to the portion to be connected T than to an end portion of the opening end surface cover portion 221, of the vertical hole 212, has an aspect ratio of less than 1 (excluding 0) and more favorably the aspect ratio of 0.1 to 0.2 or less (excluding 0).

Note that the recess 222 is not necessarily formed in the insulating film 216, and the opening end surface cover portion 221 may have a shape extending to a middle of the extending portion 213a in a thickness direction.

In such a semiconductor device 200, the low-resistance film 214 extends closer to the vicinity of the portion to be connected 2T than the semiconductor device 100. Therefore, after the low-resistance film 214 is formed, charges charged in the vicinity of the hole bottom 212b of the vertical hole 212 can be easily moved via the low-resistance film 214, and charge reduction effect is improved.

Figure 9:
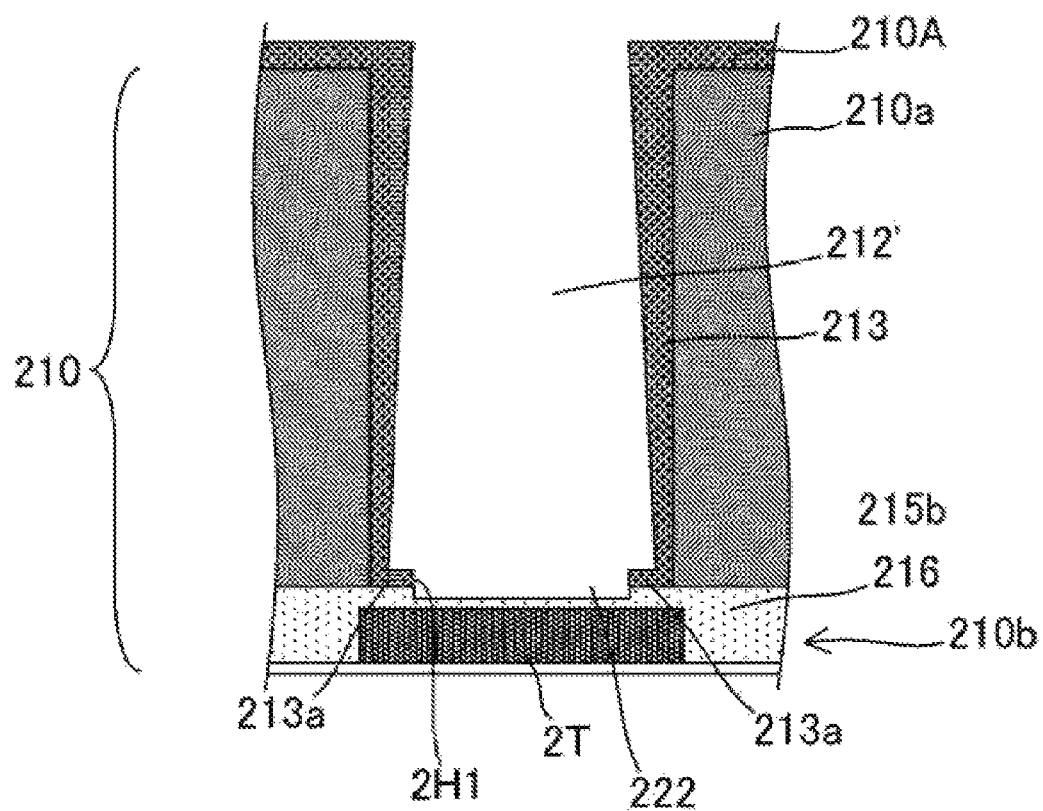
FIG. 9 is a view for describing an example of a method of manufacturing a semiconductor device according to the second embodiment.
Figure 10:
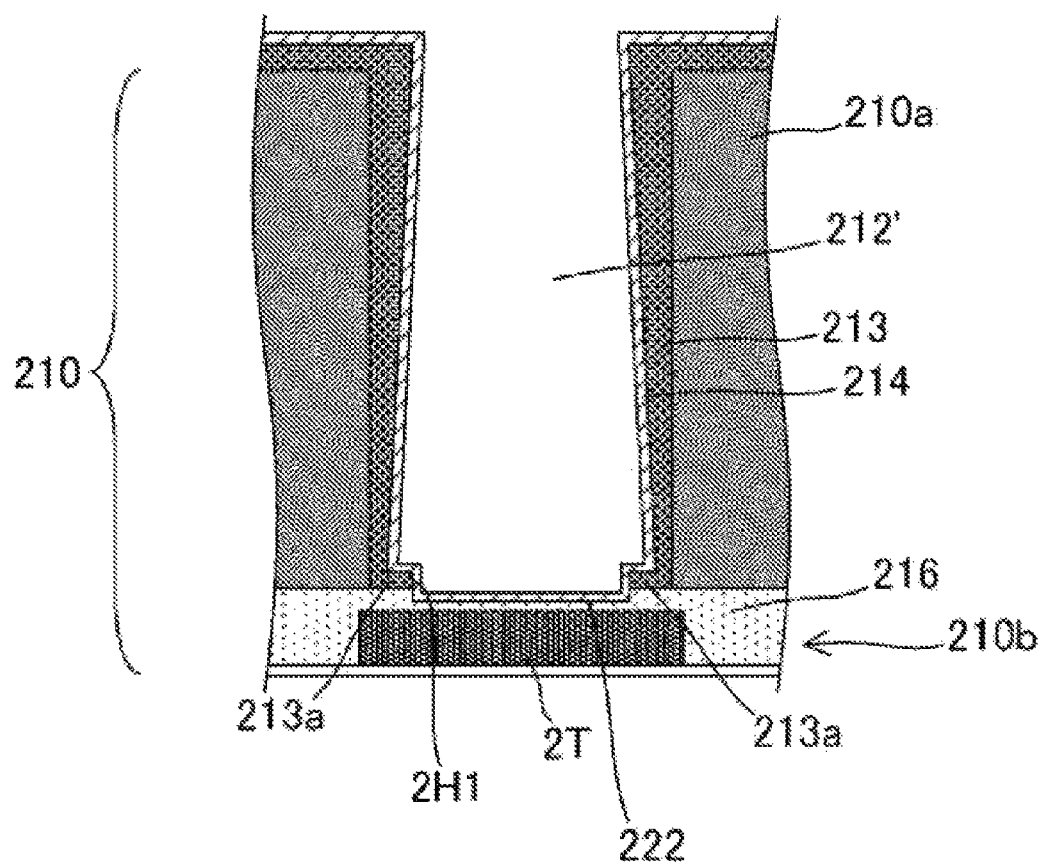
FIG. 10 is a view for describing the example of a method of manufacturing a semiconductor device according to the second embodiment.
Figure 11:
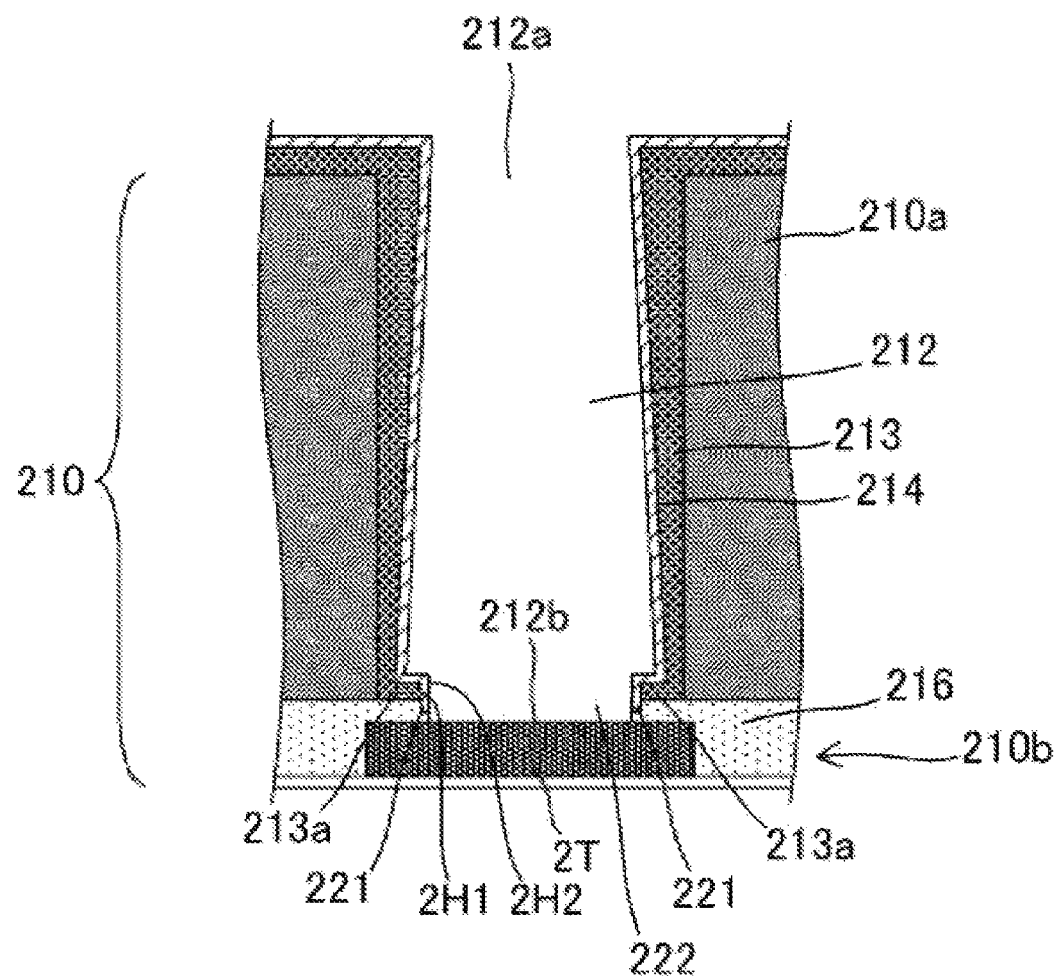
FIG. 11 is a view for describing the example of a method of manufacturing a semiconductor device according to the second embodiment.

FIGS. 9 to 11 are views for describing an example of a method of manufacturing the semiconductor device 200 according to the present embodiment. A method of manufacturing the semiconductor device 200 is similar to the method of manufacturing the semiconductor device 100 up to steps of preparation of a base 210, formation of the vertical hole 212, and formation of the insulating film 213.

After the formation of the insulating film 213, in the present embodiment, as illustrated in FIG. 9, the insulating film 213 and the insulating film 216 on a bottom of a through hole 212' as a preliminary vertical hole (or only the insulating film 213 not to reach the insulating film 216) are removed partway toward the portion to be connected 2T by plasma etching to form the recess 222 in the bottom of the through hole 212'. This plasma etching is performed using at least one or more kinds of $Cl_2$, $BCl_3$, HBr, or Ar, as an etching gas.

Next, as illustrated in FIG. 10, the low-resistance film 214 is stacked and formed on the insulating film 213 and in the recess 222.

Thereafter, as illustrated in FIG. 11, an opening is formed in the bottom of the recess 222 to expose the portion to be connected 2T. In a case of processing the low-resistance film 214 and the insulating film 216 at once, etching is performed using at least one or more kinds of a fluorocarbon gas, a hydrofluorocarbon gas, or a rare gas such as Ar, as an etching gas. In a case of processing the low-resistance film 214 and the insulating film 216 separately, etching of the low-resistance film 214 is performed using at least one or more kinds of $Cl_2$, $BCl_3$, HBr, or Ar, as an etching gas, and then etching of the insulating films 216 is performed using at least one or more kinds of a fluorocarbon gas, a hydrofluorocarbon gas, or a rare gas such as Ar, as an etching gas.

Thereafter, cleaning is performed and then a barrier metal film 215a, a conductive portion 215b, and wiring 211 are formed, so that the semiconductor device 200 illustrated in FIG. 8 is fabricated, similarly to the semiconductor device 100.

(C) Third Embodiment

Figure 12:
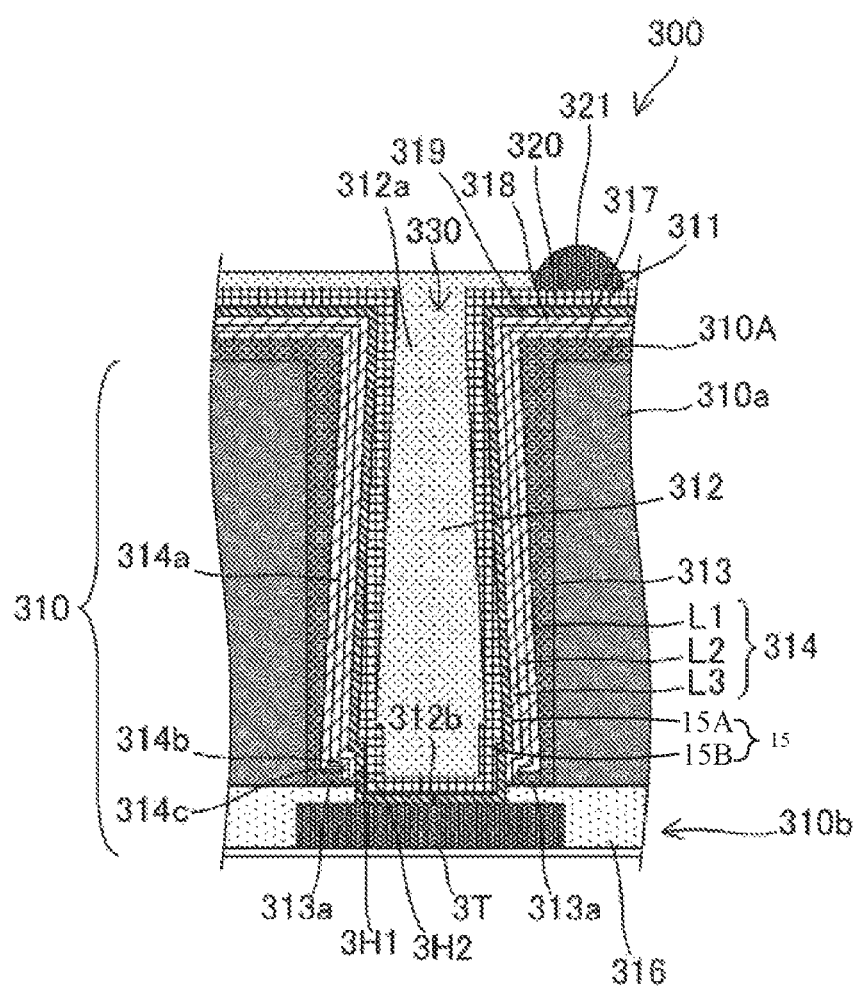
FIG. 12 is a view illustrating a cross section of a main part of a semiconductor device according to a third embodiment.

FIG. 12 is a view illustrating a cross section of a main part of a semiconductor device 300 according to the present embodiment. The semiconductor device 300 has a similar configuration to the above-described semiconductor device 100 except the number of times of stacking of a low-resistance film.

Therefore, hereinafter, a shape and a manufacturing method regarding stacking of the low-resistance film of the semiconductor device 300 will be mainly described and detailed description of other configurations is omitted, and signs are given by adding 3 to the beginning of the signs of the configuration of the semiconductor device 100 as necessary.

A low-resistance film 314 of the semiconductor device 300 is similar to the low-resistance film 14 of the semiconductor device 100 in being continuously provided from a vicinity of an opening portion 312a to a vicinity of a hole bottom 312b of a vertical hole 312 inside an insulating film 313.

The low-resistance film 314 includes a low-resistance film 314a provided along an inner side of the insulating film 313 extending along an inner wall of the vertical hole 312, a low-resistance film 314b provided along a side surface close to the opening portion 312a, of the insulating film 313a extending along the hole bottom 312b of the vertical hole 312, and further, an opening end surface cover portion 314c extending toward a portion to be connected 3T along an end surface of the insulating film 313a on an opening 3H1 side.

The low-resistance film 314 has a multilayer structure formed by being divided into two or more times. In a case of dividing the low-resistance film 314 into three times and stacking layers, the layers are called first layer L1, second layer L2, and third layer L3 in the stacked order. The low-resistance films 314a and 314b have a stacked structure in which all the three layers of the first layer L1, the second layer L2, and the third layer L3 are stacked.

Meanwhile, the opening end surface cover portion 314c has a stacked structure in which the two layers of the second layer L2 and the third layer L3 excluding the first layer L1 that is stacked first are stacked. Furthermore, the opening end surface cover portion 314c has a structure in which an end portion close to the portion to be connected T, of the third layer L3 stacked later close to a center of the vertical hole 312 extends longer and closer to the portion to be connected 3T than an end portion close to the portion to be connected T, of the second layer L2 stacked earlier. The entire low-resistance film 314 has a step-like lower structure in which an end portion close to the portion to be connected T, of a layer in a later stacked order, gradually becomes longer toward the portion to be connected T, in an order of the first layer L1, the second layer L2, and the third layer L3.

Even in this case, a portion closer to the portion to be connected T than to the entire low-resistance film 314, of the vertical hole 312, has an aspect ratio of less than 1 (excluding 0) and more favorably the aspect ratio of 0.1 to 0.2 or less (excluding 0).

In such a semiconductor device 300, the low-resistance film 314 extends closer to the vicinity of the portion to be connected 3T than the semiconductor device 100. Therefore, after the low-resistance film 314 is formed, charges charged in the vicinity of the hole bottom 312b of the vertical hole 312 can be easily moved via the low-resistance film 314, and effect of reducing charges in the vicinity of the hole bottom 312b of the vertical hole 312 is improved.

FIGS. 13 to 17 are views for describing an example of a method of manufacturing the semiconductor device 300 according to the present embodiment. A method of manufacturing the semiconductor device 300 is similar to the method of manufacturing the semiconductor device 100 up to steps of preparation of a base 310, formation of the vertical hole 312, formation of the insulating film 313, and formation of the low-resistance film 314 (first layer L1).

Figure 13:
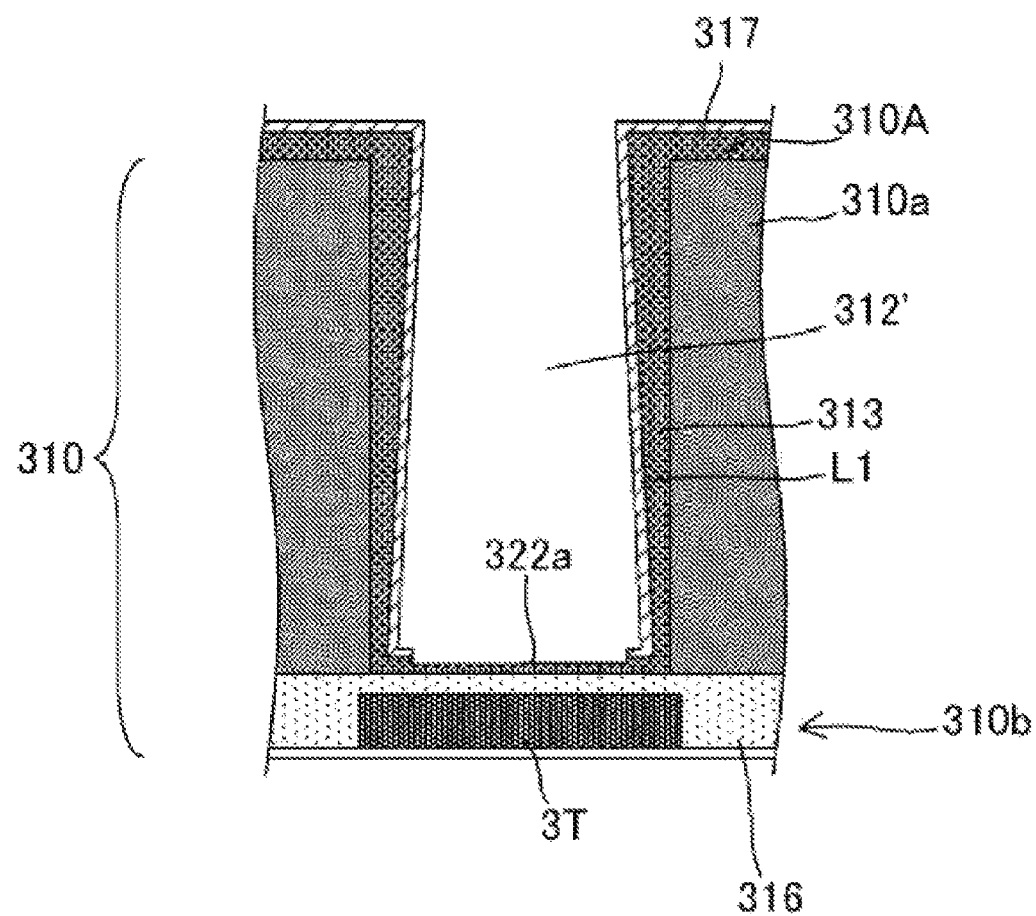
FIG. 13 is a view for describing an example of a method of manufacturing a semiconductor device according to the third embodiment.

After the formation of the low-resistance film 314 corresponding to the first layer L1, in the present embodiment, a first recess 322a not reaching the portion to be connected 3T is formed in a bottom of a through hole 312' as a preliminary vertical hole, as illustrated in FIG. 13. The method of etching the low-resistance film 314 and the insulating films 313 and 316 is similar to the method in the first embodiment.

Figure 14:
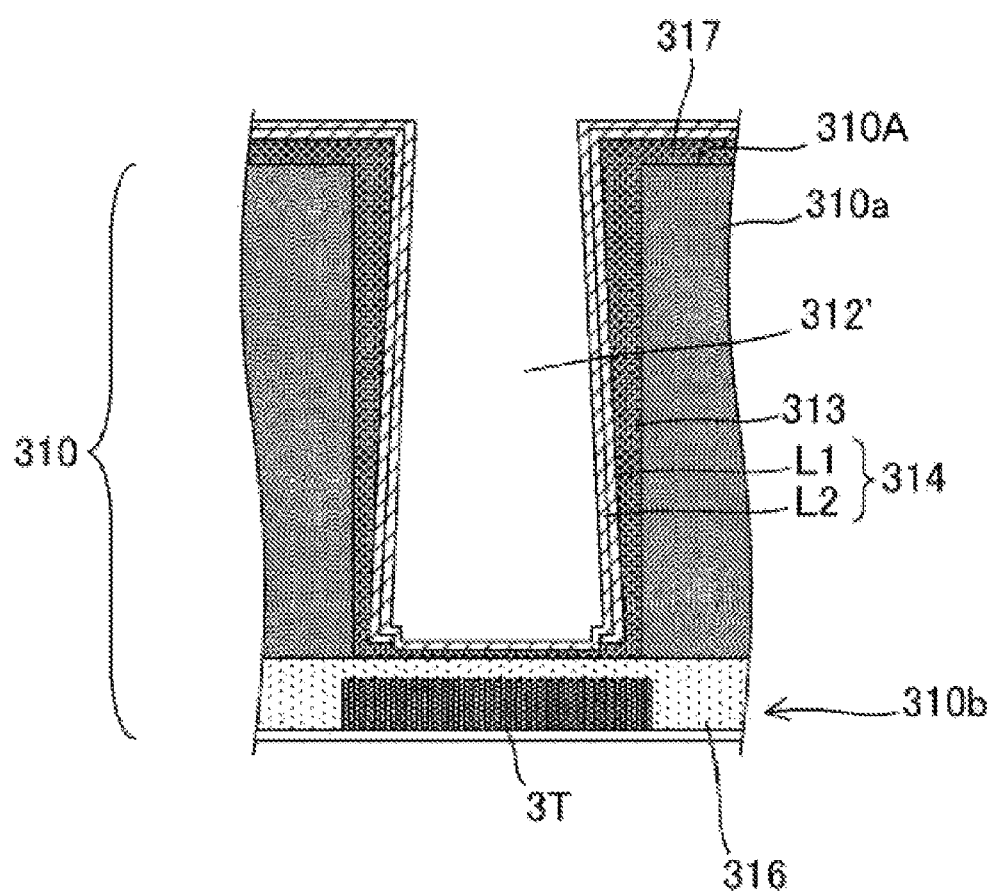
FIG. 14 is a view for describing the example of a method of manufacturing a semiconductor device according to the third embodiment.

Then, as illustrated in FIG. 14, the low-resistance film 314 corresponding to the second layer L2 is stacked and formed on the entire through hole 312' including an inside of the first recess 322a. In other words, a portion where the first layer L1 remains has the second layer L2 stacked on the first layer L1, and the low-resistance film 314 has a multilayer structure.

Figure 15:
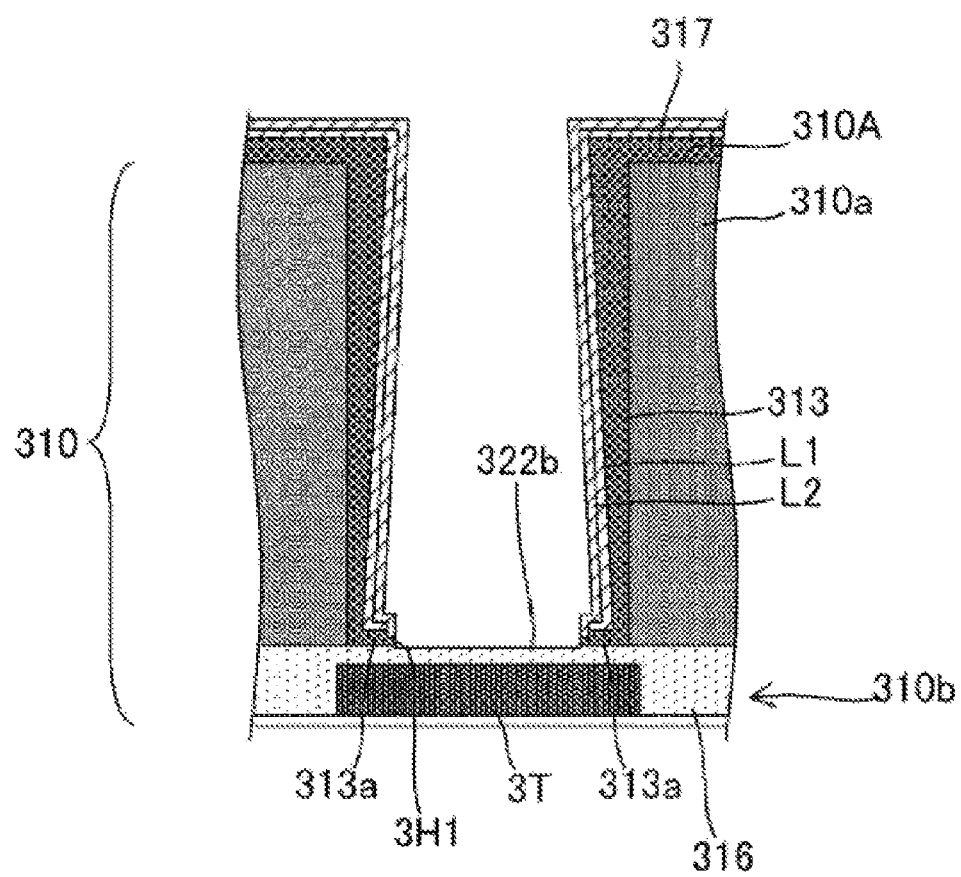
FIG. 15 is a view for describing the example of a method of manufacturing a semiconductor device according to the third embodiment.

Next, as illustrated in FIG. 15, a second recess 322b not reaching the portion to be connected 3T is mainly formed on a bottom of the first recess 322a.

Figure 16:
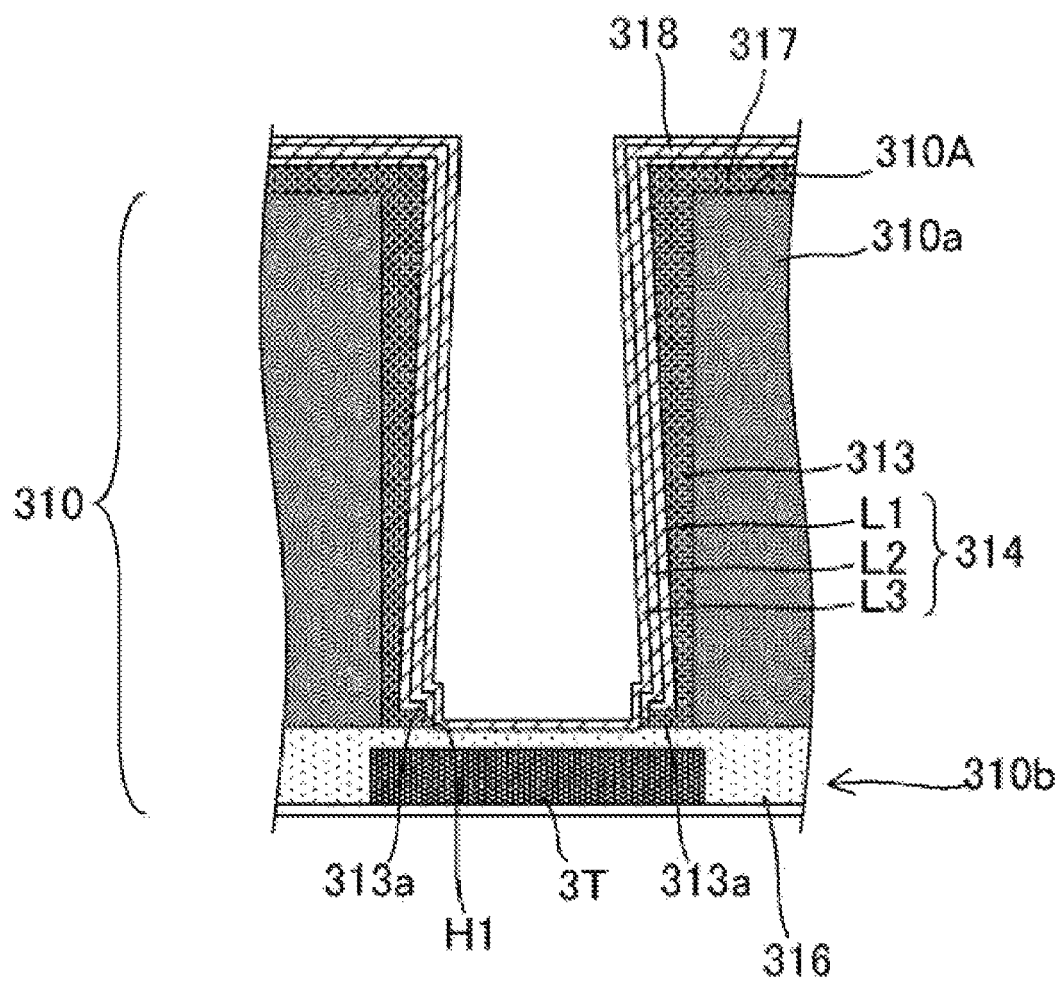
FIG. 16 is a view for describing the example of a method of manufacturing a semiconductor device according to the third embodiment.

Then, as illustrated in FIG. 16, the low-resistance film 314 corresponding to the third layer L3 is stacked and formed on the entire through hole 312' including an inside of the second recess 322b. In other words, a portion where the second layer L2 remains has the third layer L3 stacked on the second layer L2, and has a multilayer structure in which the three layers of the first layer L1, the second layer L2, and the third layer L3 are stacked or a multilayer structure in which the two layers of the second layer L2 and the third layer L3 are stacked.

Figure 17:
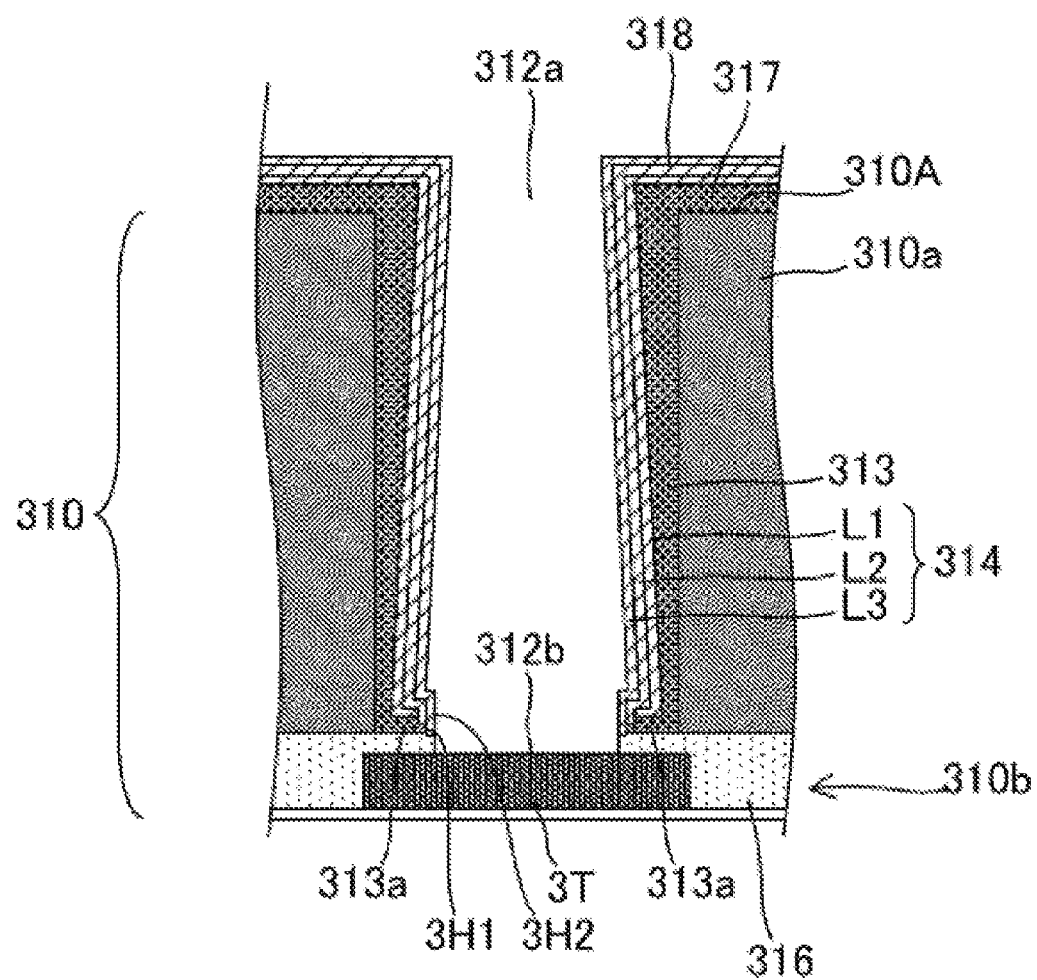
FIG. 17 is a view for describing the example of a method of manufacturing a semiconductor device according to the third embodiment.

Thereafter, as illustrated in FIG. 17, an opening is formed in the bottom of the second recess 322b to expose the portion to be connected 3T.

Thereafter, cleaning is performed and then a barrier metal film 15a, a conductive portion 15b, and wiring 311 are formed, so that the semiconductor device 300 illustrated in FIG. 12 is fabricated, similarly to the semiconductor device 100.

(D) Fourth Embodiment

Figure 18:
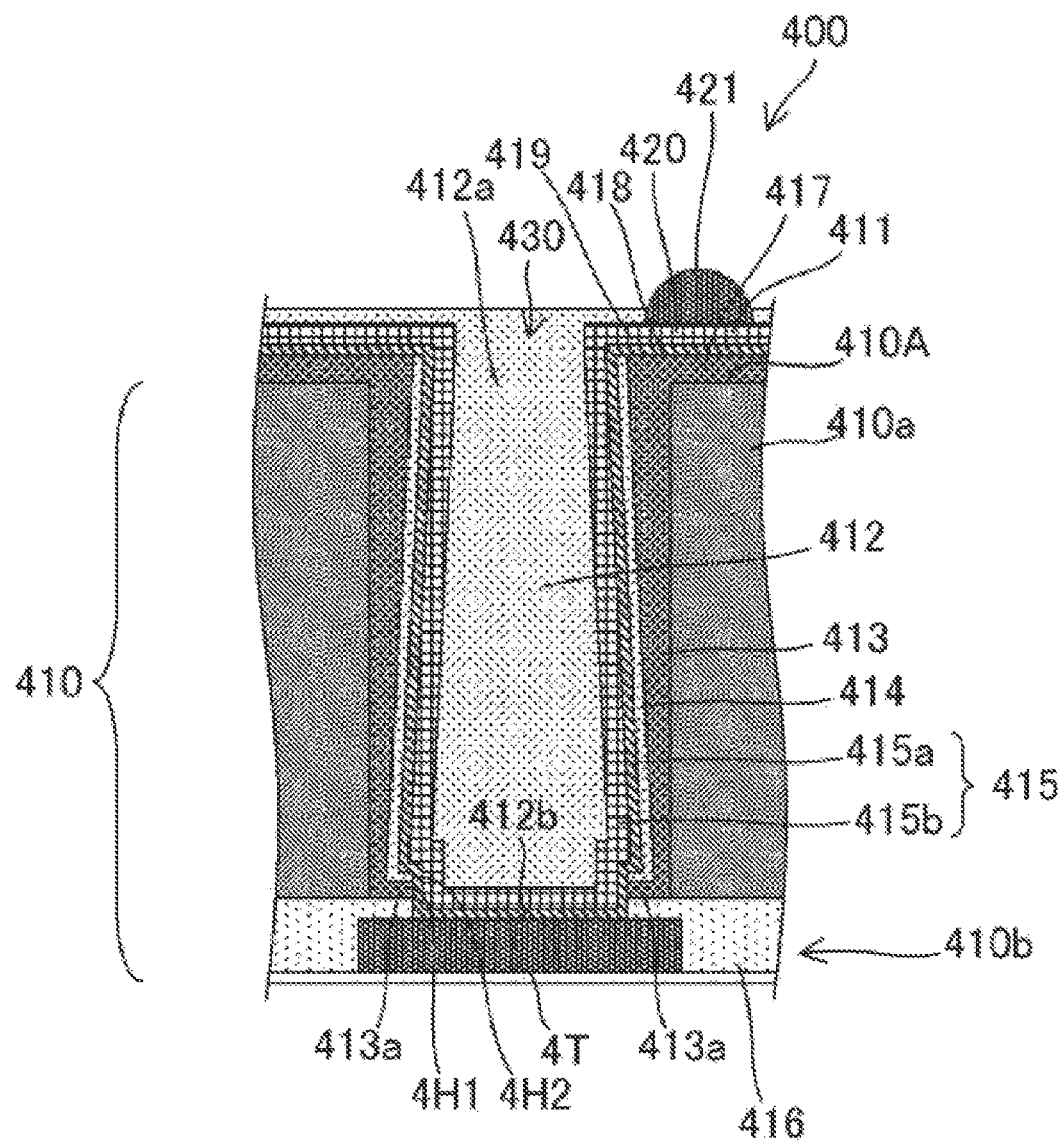
FIG. 18 is a view illustrating a cross section of a main part of a semiconductor device according to a fourth embodiment.

FIG. 18 is a view illustrating a cross section of a main part of a semiconductor device 400 according to the present embodiment. The semiconductor device 400 has a similar configuration to the above-described semiconductor device 100 except an entire shape and a manufacturing method of a low-resistance film.

Therefore, hereinafter, the entire shape and the manufacturing method of the low-resistance film of the semiconductor device 400 will be mainly described and detailed description of other configurations is omitted, and signs are given by adding 4 to the beginning of the signs of the configuration of the semiconductor device 100 as necessary.

A low-resistance film 414 of the semiconductor device 400 is similar to the low-resistance film 14 of the semiconductor device 100 in being continuously provided from a vicinity of an opening portion 412a to a vicinity of a hole bottom 412b of a vertical hole 412 inside an insulating film 413.

An insulating film 417, a barrier metal film 419, and a conductive portion 420 are sequentially stacked on one surface 410A of a base 410. Although another film may lie between these films, the low-resistance film 414 is not stacked on the one surface 410A. Note that, the low-resistance film 414 provided along an inner side of the insulating film 413 extending along an inner wall of the vertical hole 412 has a substantially uniform film thickness in the entire depth direction of the hole. Therefore, after the low-resistance film 414 is formed, reduction characteristics of charges charged in the vicinity of the hole bottom 412b of the vertical hole 412 becomes stabilized.

A method of manufacturing the semiconductor device 400 is similar to the method of manufacturing the semiconductor device 100 up to steps of preparation of the base 410, formation of the vertical hole 412, and formation of the insulating film 413.

After the formation of the insulating film 413, in the present embodiment, the low-resistance film 414 is stacked on the insulating film 413. The low-resistance film 414 is similar in material to the low-resistance film 14 according to the first embodiment but the low-resistance film 414 is formed to have a substantially uniform film thickness as a whole including a low-resistance film 418 by a high coverage atomic layer deposition (ALD) method as a film forming method.

Next, an opening is formed in a bottom of a through hole 412' as a preliminary vertical hole by, for example, plasma etching to expose a portion to be connected 4T, similarly to the first embodiment. Note that, since the low-resistance film 14 according to the present embodiment is formed by the high coverage film forming method, the low-resistance film 414 formed in a field portion of the base 10 is removed by the etching, and only the low-resistance film 414 in the vertical hole 412 remains.

Thereafter, an opening is formed in a bottom of the through hole 412' to expose the portion to be connected 4T and cleaning is performed, and then a barrier metal film 415a, a conductive portion 415b, and wiring 411 are formed, so that the semiconductor device 400 illustrated in FIG. 18 is fabricated, similarly to the semiconductor device 100.

(E) Fifth Embodiment

Figure 19:
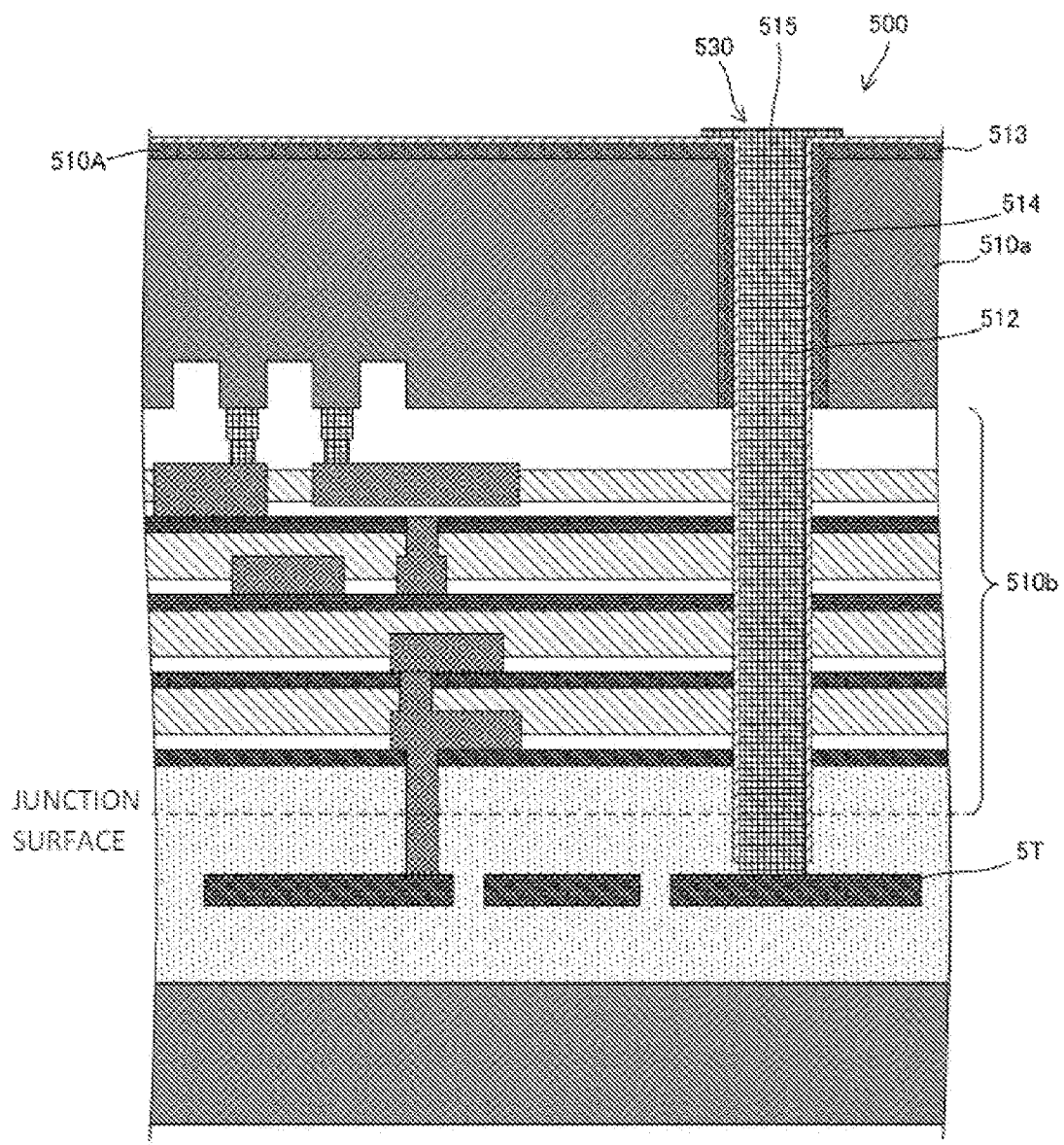
FIG. 19 is a view illustrating a cross section of a main part of a semiconductor device according to a fifth embodiment.

FIG. 19 is a view illustrating a cross section of a main part of a solid-state image sensor 500 according to the present embodiment. A vertical electrode 530 of the solid-state image sensor 500 according to the present embodiment is substantially different from the above-described vertical electrode 30 of the first embodiment in penetrating a wiring layer from a back surface of a semiconductor substrate and being connected to a portion to be connected provided in another semiconductor element bonded to the back surface of the semiconductor substrate.

Therefore, hereinafter, a schematic configuration and a manufacturing method of the vertical electrode 530 will be mainly described and detailed description of other configurations is omitted, and signs are given to a configuration similar to the configuration of the semiconductor device 100 by adding 5 to the beginning of the signs of the of the semiconductor device 100 as necessary.

The solid-state image sensor 500 is an example of stacking and forming a wiring layer 510b on a surface 10B of a semiconductor substrate 510a provided with photoelectric conversion elements, transistors, and the like, then joining another semiconductor element on the wiring layer 510b by bonding, and forming a through electrode penetrating the wiring layer 510b from a back surface 510A side of the semiconductor substrate 510a and reaching a metal electrode pad as a portion to be connected provided in the bonded and joined semiconductor element.

FIGS. 20 to 23 are views schematically illustrating a method of manufacturing a main part of the solid-state image sensor 500 according to the present embodiment.

Figure 20:
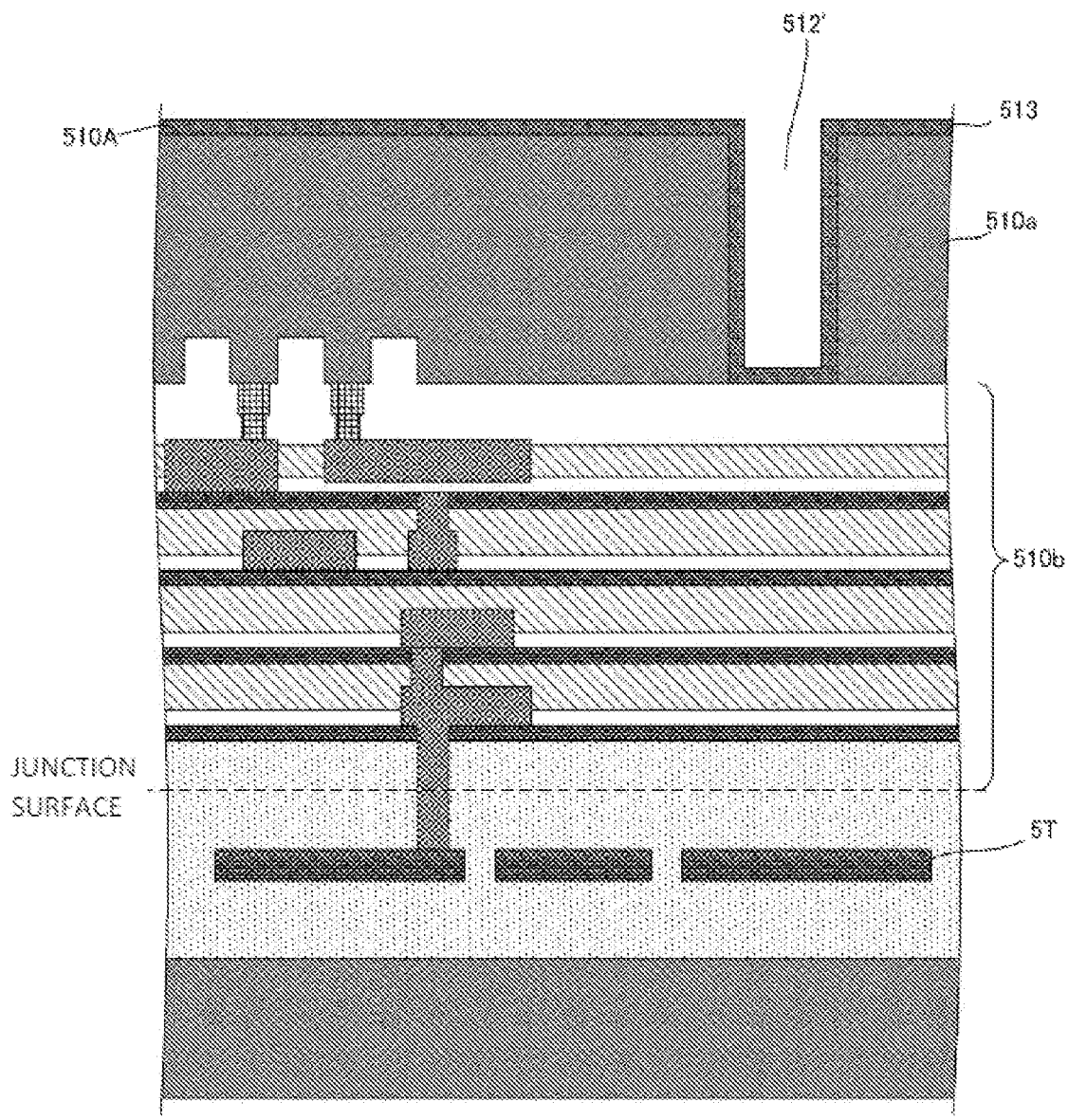
FIG. 20 is a view for describing an example of a method of manufacturing a semiconductor device according to the fifth embodiment.

As illustrated in FIG. 20, in the method of manufacturing the solid-state image sensor 500, first, a through hole 512' as a preliminary vertical hole penetrating the semiconductor substrate 510a is formed, and an insulating film 513 is stacked and formed on the back surface 510A of the semiconductor substrate 510a and an entire inner surface of the through hole 512'.

Figure 21:
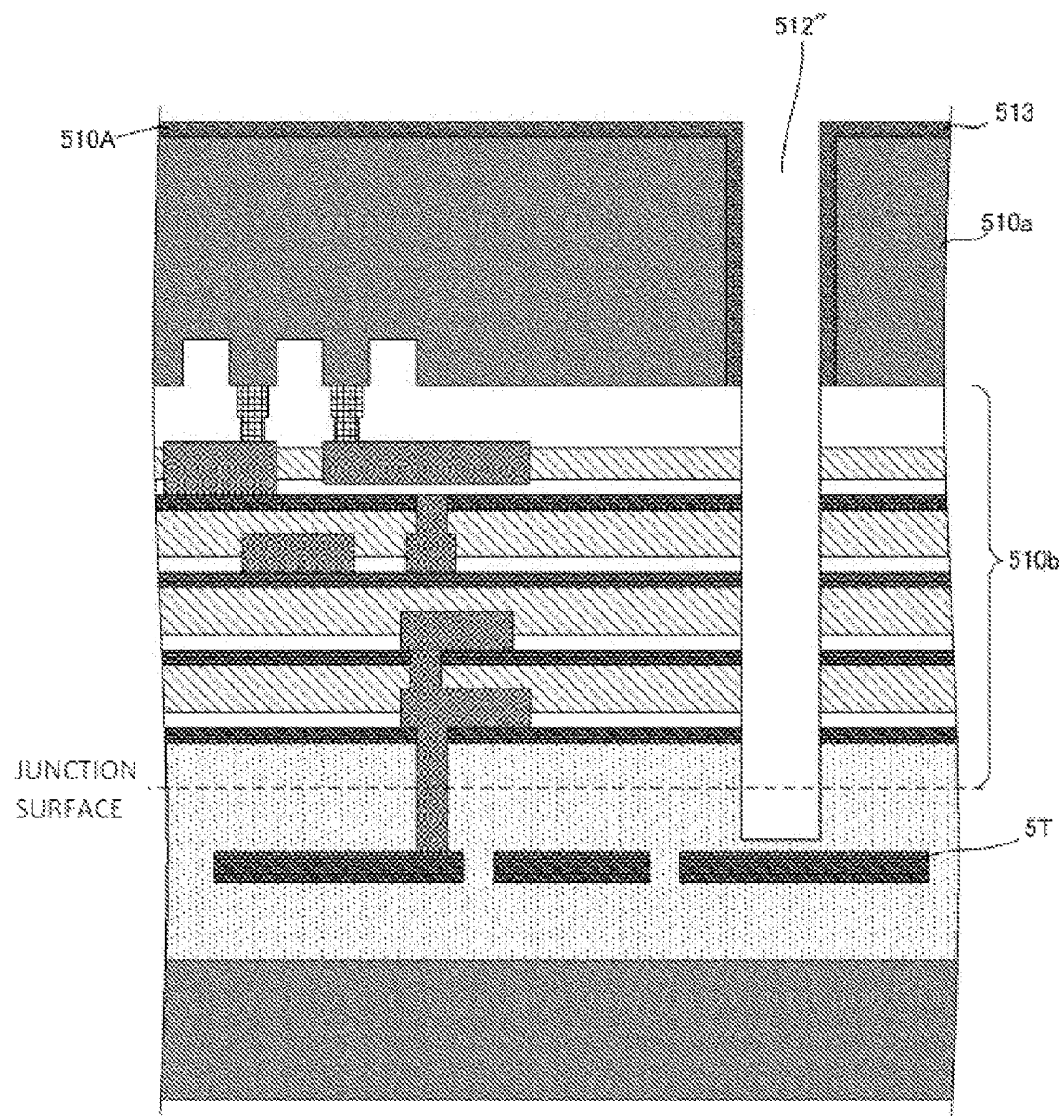
FIG. 21 is a view for describing the example of a method of manufacturing a semiconductor device according to the fifth embodiment.
Figure 22:
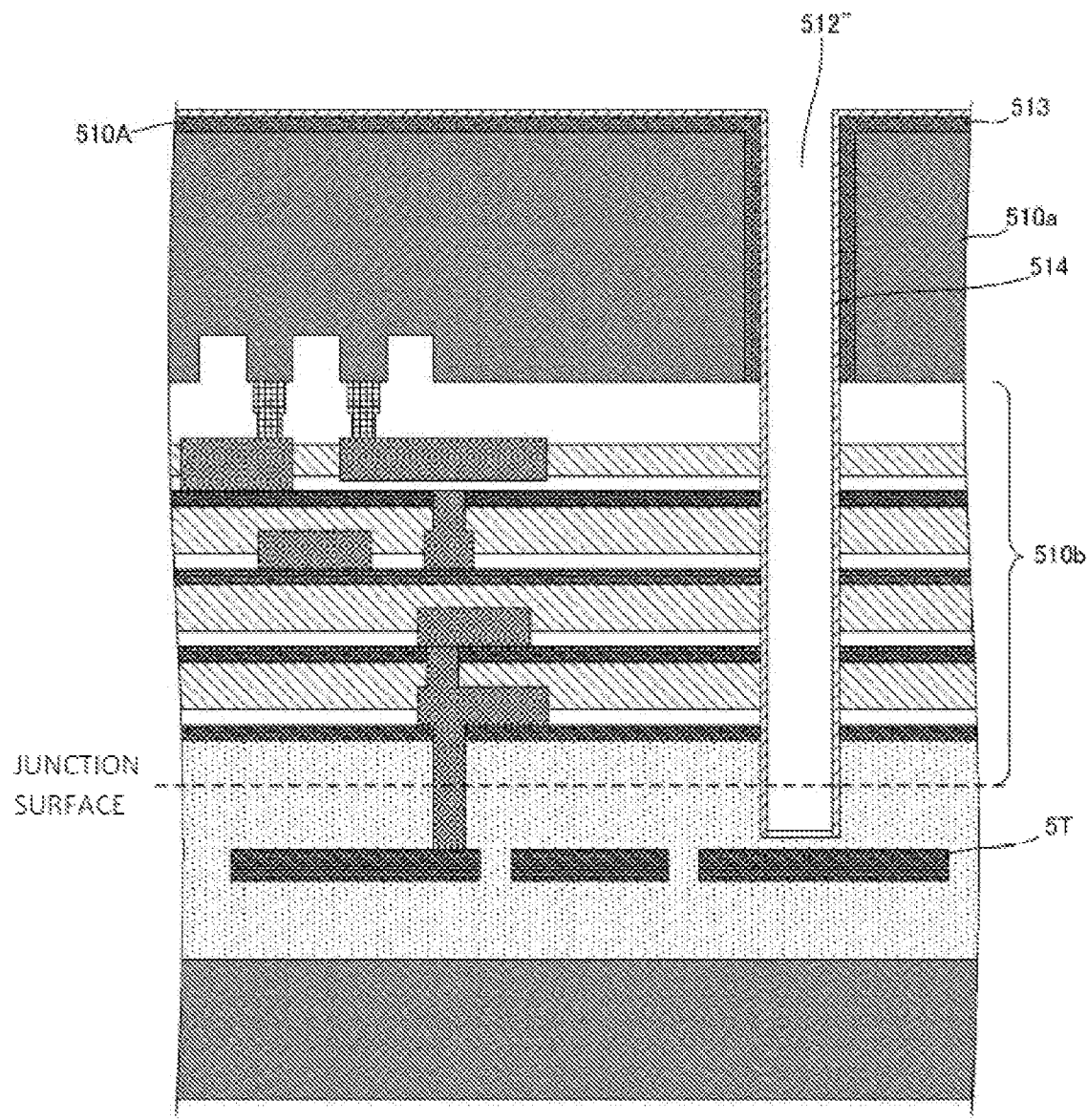
FIG. 22 is a view for describing the example of a method of manufacturing a semiconductor device according to the fifth embodiment.
Figure 23:
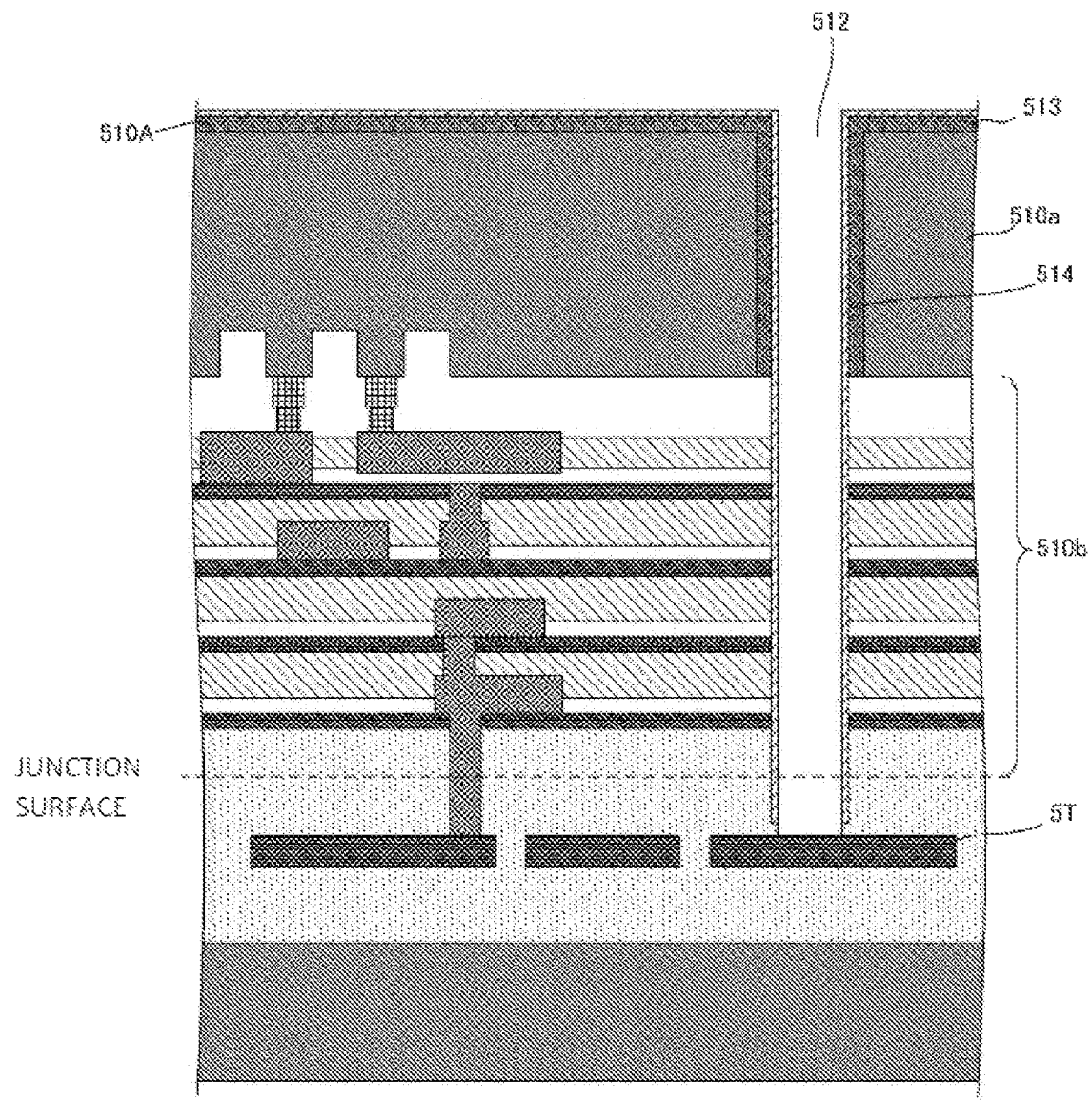
FIG. 23 is a view for describing the example of a method of manufacturing a semiconductor device according to the fifth embodiment.

Thereafter, a bottom portion of the through hole 512' is excavated and extended by plasma etching, and a through hole 512" as a preliminary vertical hole penetrating the wiring layer 510b and reaching a vicinity of the metal electrode pad as a portion to be connected 5T is formed (FIG. 21). The through hole 512" thus formed as a vertical hole has an insulating film exposed on an entire inner wall of the hole. A low-resistance film 514 is formed on an inside of the through hole 512" and the insulating film 513 in a field portion of the semiconductor substrate 510a (FIG. 22). Thereafter, the low-resistance film 514 formed on the hole bottom of the through hole 512" and the insulating film between the low-resistance film 514 and the portion to be connected 5T are removed by etching to expose the portion to be connected 5T (FIG. 23). A barrier metal film is formed on a vertical hole 512 penetrating up to the portion to be connected 5T, similarly to the first embodiment, and a conductive portion is formed or filled to form an electrode portion 515 (see FIG. 19).

As a result, the through hole penetrating the wiring layer 510b from the back surface 510A side of the semiconductor substrate 510a and reaching the metal electrode pad as the portion to be connected provided in the bonded and joined semiconductor element can be formed while charging damage during formation of the through electrode is reduced.

Note that the present technology is not limited to the above-described embodiments and includes configurations in which the configurations disclosed in the above-described embodiments are mutually replaced or changed in combination, configurations in which the configurations disclosed in the prior art and in the above-described embodiments are mutually replaced or changed in combination, and the like. Furthermore, the technical scope of the present technology is not limited to the above-described embodiments but extends to matters described in the claims and equivalents thereof.

Then, the present technology can have the following configurations.

(1)

A semiconductor device including:

a vertical electrode formed in a vertical hole extending from an opening portion toward a portion to be connected along a thickness direction of a base, and having a structure in which a barrier metal film and a conductive material are stacked sequentially from a side close to a first insulating film exposed to the vertical hole; and a low-resistance film provided to lie between the barrier metal film and the first insulating film except a vicinity of the portion to be connected, and having a lower resistance value than a resistance value of the first insulating film.

(2)

The semiconductor device according to (1), in which the low-resistance film is configured by at least one of Ti, TiN, Ta, TaN, Zr, ZrN, Hf, HfN, Ru, Co, W, WN, Mn, MnN, Al, Sn, Zn, Si, Ge, Ga or SiN.

(3)

The semiconductor device according to (1) or (2), in which the first insulating film and the barrier metal film have an extending portion extending along a field portion of the base, and the low-resistance film is also provided to lie between the first insulating film and the barrier metal film along the field portion of the base.

(4)

The semiconductor device according to (1) or (2), in which the first insulating film and the barrier metal film have an extending portion extending along a field portion of the base, and the low-resistance film is not provided between the first insulating film and the barrier metal film running along the field portion of the base.

(5)

The semiconductor device according to any one of (1) to (4), in which a film thickness of the low-resistance film is thicker in a portion closer to an opening of the vertical hole in a depth direction of the vertical hole.

(6)

The semiconductor device according to any one of (1) to (5), in which a film thickness of the low-resistance film is substantially uniform in a depth direction of the vertical hole.

(7)

The semiconductor device according to any one of (1) to (6), in which an end portion of the low-resistance film, the end portion being close to the portion to be connected, does not reach a second insulating film stacked on a side surface of the portion to be connected, the side surface being on a side of the opening portion.

(8)

The semiconductor device according to any one of (1) to (6), in which an end portion of the low-resistance film, the end portion being close to the portion to be connected, reaches a second insulating film stacked on a side surface of the portion to be connected, the side surface being on a side of the opening portion.

(9)

The semiconductor device according to any one of (1) to (8), in which the low-resistance film has a stacked structure in which a plurality of low-resistance films is formed by stacking, and an end portion of the low-resistance film stacked closer to a center of the vertical hole is formed to extend longer and closer to the portion to be connected.

(10)

The semiconductor device according to any one of (1) to (9), in which the vertical electrode has a diameter of 10 μm or more and an aspect ratio of 1 or more.

(11)

The semiconductor device according to any one of (1) to (10), in which an aspect ratio of a portion having a side wall not provided with the low-resistance film in a hole bottom of the vertical hole is less than 1 (excluding 0).

(12)

A method of manufacturing a semiconductor device, the method including:

a first step of forming a preliminary vertical hole in a base, the preliminary vertical hole having an insulating film exposed to a hole wall and having a hole bottom having a depth not reaching a portion to be connected;

a second step of forming a low-resistance film having a lower resistance value than a resistance value of the insulating film inside the preliminary vertical hole from above the insulating film;

a third step of opening the hole bottom of the preliminary vertical hole with the low-resistance film and the insulating film up to the portion to be connected by etching to form a vertical hole; and a fourth step of forming a barrier metal film in the vertical hole communicating with the portion to be connected, and forming or filling a conductive material from above the barrier metal film to form a vertical electrode.

(13)

The method of manufacturing a semiconductor device according to (12), in which a step of etching the hole bottom of the preliminary vertical hole with the low-resistance film and the insulating film to an extent not to reach the portion to be connected and further forming the low-resistance film inside the preliminary vertical hole from above an etched portion is repeated once or more between the second step and the third step.

(14)

The method of manufacturing a semiconductor device according to (12) or (13), in which removal of the low-resistance film and the insulating film is performed by plasma etching, and any one or more of a fluorocarbon gas, a hydrofluorocarbon gas, or a rare gas is used in the plasma etching.

(15)

A solid-state image sensor including a vertical electrode formed in a vertical hole extending from an opening portion in a back surface of a semiconductor substrate toward a portion to be connected in a wiring layer stacked on a surface of the semiconductor substrate along a thickness direction of the semiconductor substrate, in which the vertical electrode has a structure in which a barrier metal film and a conductive material are stacked sequentially from a side close to an insulating film exposed to the vertical hole, and a low-resistance film having a lower resistance value than a resistance value of the insulating film is provided to lie between the barrier metal film and the insulating film except a vicinity of the portion to be connected.

REFERENCE SIGNS LIST

10 Base
10A Surface
10B Surface
10a Semiconductor substrate
10b Wiring layer
11 Wiring
12 Vertical hole
12' Through hole
12a Opening portion
12b Hole bottom
13 Insulating film
13a Extending portion
13a1 Side surface
13a2 End surface
14 Low-resistance film
15 Electrode portion
15a Barrier metal film
15b Conductive portion
16 Insulating film
17 Insulating film
18 Low-resistance film
19 Barrier metal film
20 Conductive portion
21 Bump
30 Vertical electrode
100 Semiconductor device
200 Semiconductor device
210 Base
211 Wiring
212 Vertical hole
212' Through hole
212a Opening portion
212b Hole bottom
213 Insulating film
213a Extending portion
214 Low-resistance film
215a Barrier metal film
215b Conductive portion
216 Insulating film
221 Opening end surface cover portion 222 Recess
300 Semiconductor device
310 Base
311 Wiring
312 Vertical hole
312' Through hole
312a Opening portion
312b Hole bottom
313 Insulating film
313a Insulating film
314 Low-resistance film
314a Low-resistance film
314b Low-resistance film
314c Opening end surface cover portion
315a Barrier metal film
315b Conductive portion
316 Insulating film
322a First recess
322b Second recess
400 Semiconductor device
410 Base
410A Surface
411 Wiring
412 Vertical hole
412' Through hole
412a Opening portion
412b Hole bottom
413 Insulating film
414 Low-resistance film
415a Barrier metal film
415b Conductive portion
417 Insulating film
418 Low-resistance film
419 Barrier metal film
420 Conductive portion
500 Solid-state image sensor
510A Back surface
510a Semiconductor substrate
510b Wiring layer
530 Vertical electrode
512 Vertical hole
512' Through hole
512" Through hole
512b Hole bottom
513 Insulating film
514 Low-resistance film
515 Electrode portion
H1 Opening
H2 Opening
H3 Opening
L1 First layer
L2 Second layer
L3 Third layer
T Portion to be connected
2T Portion to be connected
2H1 Opening
3T Portion to be connected
3H1 Opening
4T Portion to be connected
5T Portion to be connected

The invention claimed is:

1. A semiconductor device, comprising:
a vertical electrode in a vertical hole, wherein the vertical hole has an opening portion and a hole bottom;
a base, wherein
the vertical electrode extends from the opening portion of the vertical hole toward a portion to be connected, the vertical electrode extends along a thickness direction of the base, and
the vertical electrode comprises a structure that includes a barrier metal film and a conductive material;
a first insulating film exposed to the vertical hole, wherein
the barrier metal film and the conductive material are stacked sequentially from a side close to the first insulating film,
the first insulating film has a tapered shape with a thickness of the first insulating film gradually decreases from the opening portion of the vertical hole toward the hole bottom of the vertical hole,
each of the first insulating film and the barrier metal film has an extending portion,
the extending portion extends from the first insulating film toward a center of the vertical hole in a radial direction, and
the extending portion has a length less than a length between the center and the first insulating film; and
a low-resistance film, wherein
the low-resistance film is between the barrier metal film and the first insulating film except in a vicinity of the portion to be connected,
a resistance value of the low-resistance film is lower than a resistance value of the first insulating film, and
a film thickness of the low-resistance film is thicker in the opening portion of the vertical hole than the hole bottom of the vertical hole.

2. The semiconductor device according to claim 1, wherein the low-resistance film comprises at least one of Ti, TiN, Ta, TaN, Zr, ZrN, Hf, HfN, Ru, Co, W, WN, Mn, MnN, Al, Sn, Zn, Si, Ge, Ga, or SiN.

3. The semiconductor device according to claim 1, wherein
the low-resistance film is between the extending portion of the first insulating film and the extending portion of the barrier metal film.

4. The semiconductor device according to claim 1, wherein the first insulating film and the barrier metal film have an extending portion extending along a field portion of the base, and the low-resistance film is not provided between the first insulating film and the barrier metal film running along the field portion of the base.

5. The semiconductor device according to claim 1, wherein a film thickness of the low-resistance film is substantially uniform in a depth direction of the vertical hole.

6. The semiconductor device according to claim 1, wherein an end portion of the low-resistance film, the end portion being close to the portion to be connected, does not reach a second insulating film stacked on a side surface of the portion to be connected, the side surface being on a side of the opening portion.

7. The semiconductor device according to claim 1, further comprising a second insulating film stacked on a side surface of the portion to be connected, wherein
the side surface of the portion to be connected is on a side of the opening portion of the vertical hole, and
an end portion of the low-resistance film, the end portion that is close to the portion to be connected, reaches the second insulating film.

8. The semiconductor device according to claim 1, wherein
the low-resistance film comprises a stacked structure that includes a stack of a plurality of layers of low-resistance films, a first layer of the plurality of layers of low-resistance films is stacked closest to the center of the vertical hole, and the first layer extends longer and closer to the portion to be connected than a second layer of the plurality of layers of low-resistance films other than the first layer.

9. The semiconductor device according to claim 1, wherein the vertical electrode has a diameter of at least 10 µm and an aspect ratio of at least 1.

10. The semiconductor device according to claim 1, wherein an aspect ratio of a portion of the hole bottom having a side wall not provided with the low-resistance film is less than 1 (excluding 0).

11. A solid-state image sensor, comprising:
a vertical electrode in a vertical hole, wherein the vertical hole has an opening portion and a hole bottom;
a semiconductor substrate;
a wiring layer stacked on the semiconductor substrate, wherein
the vertical electrode extends from the opening portion of the vertical hole, in a back surface of the semiconductor substrate, toward a portion to be connected,
the vertical electrode extends in the wiring layer along a thickness direction of the semiconductor substrate, and
the vertical electrode comprises a structure that includes a barrier metal film and a conductive material;
an insulating film exposed to the vertical hole, wherein
the barrier metal film and the conductive material are stacked sequentially from a side close to the insulating film,
the insulating film has a tapered shape with a thickness of the insulating film gradually decreases from the opening portion of the vertical hole toward the hole bottom of the vertical hole,
each of the insulating film and the barrier metal film has an extending portion,
the extending portion extends from the insulating film toward a center of the vertical hole in a radial direction, and
the extending portion has a length less than a length between the center and the insulating film; and
a low-resistance film, wherein
a resistance value of the low-resistance film is lower than a resistance value of the insulating film, and
the low-resistance film is between the barrier metal film and the insulating film except in a vicinity of the portion to be connected.

* * * * *